(12) United States Patent
Kim et al.

(10) Patent No.: US 12,193,181 B2
(45) Date of Patent: Jan. 7, 2025

(54) DISPLAY DEVICE

(71) Applicant: Samsung Display Co., LTD., Yongin-si (KR)

(72) Inventors: Won Tae Kim, Yongin-si (KR); Soo Hyun Moon, Yongin-si (KR); Jun Seok Min, Yongin-si (KR); Hae Ju Yun, Yongin-si (KR); Woo Guen Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 216 days.

(21) Appl. No.: 18/074,251

(22) Filed: Dec. 2, 2022

(65) Prior Publication Data

US 2023/0225067 A1    Jul. 13, 2023

(30) Foreign Application Priority Data

Jan. 13, 2022    (KR) ........................ 10-2022-0005542

(51) Int. Cl.
  *H05K 5/02*    (2006.01)
  *H01L 25/16*   (2023.01)
(52) U.S. Cl.
  CPC ......... *H05K 5/0247* (2013.01); *H05K 5/0217* (2013.01); *H01L 25/167* (2013.01)

(58) Field of Classification Search
  CPC ...................................................... H05K 7/18
  See application file for complete search history.

(56) References Cited

U.S. PATENT DOCUMENTS

| | | | |
|---|---|---|---|
| 11,177,726 B2 * | 11/2021 | Schuler | H02K 3/28 |
| 2017/0013726 A1 * | 1/2017 | Han | G09F 15/0062 |
| 2021/0183275 A1 | 6/2021 | Han et al. | |

FOREIGN PATENT DOCUMENTS

EP    3270468 A1    1/2018

* cited by examiner

*Primary Examiner* — Jerry Wu
(74) *Attorney, Agent, or Firm* — Lewis Roca Rothgerber Christie LLP

(57) ABSTRACT

A display device may include: a display panel including pixels; a housing configured to receive the display panel, the housing including a slot at one side surface of the housing; a rotator located in the housing and configured to wind or deploy the display panel; a circuit board located in the rotator, and electrically connected to the pixels; a connector located in the housing, and electrically connected to the circuit board; and a support component configured to support the connector.

18 Claims, 35 Drawing Sheets

PCB: BS2, EL1, EL2
TH: OPN2, OPN3
EL1: EL1_1, EL1_2
EL2: EL2_1, EL2_2

PCB: BS2, EL1, EL2
EL1: EL1_1, EL1_2
EL2: EL2_1, EL2_2

PCB: BS2, EL1, EL2

PCB: BS2, EL1, EL2

PCB: BS2, EL1~EL4

PCB: BS2, EL

PCB: BS2, EL

PCB: BS2, PRP, EL

PCB: BS2, EL1, EL2
EL1: EL1_1, EL1_2
EL2: EL2_1, EL2_2

PCB: BS2, EL

PCB: BS2, EL1, EL2
CNT: CNT1, CNT2
CNE: CNE1, CNE2
EL1: EL1_1, EL1_2
EL2: EL2_1, EL2_2

DISPLAY DEVICE

CROSS-REFERENCE TO RELATED APPLICATION

This application claims priority to and the benefit of Korean Patent Application number 10-2022-0005542 filed on Jan. 13, 2022, in the Korean Intellectual Property Office, the entire disclosure of which is incorporated by reference herein.

BACKGROUND

1. Field

Various embodiments of the present disclosure relate to a display device.

2. Description of Related Art

Recently, as interest in information display increases, research and development on display devices have been continuously conducted.

SUMMARY

Various embodiments of the present disclosure are directed to a display device in which a structure including a connector and a support component is disposed inside a housing, and a circuit board exposed out of a rotator (or a roller) is electrically connected to the connector.

One or more embodiments of the present disclosure include a display device including: a display panel including pixels; a housing configured to receive the display panel, the housing including a slot at one side surface of the housing; a rotator located in the housing and configured to wind or deploy the display panel; a circuit board located in the rotator, and configured to be electrically connected to the pixels; a connector located in the housing, and electrically connected to the circuit board; and a support component configured to support the connector.

In one or more embodiments, the connector may include: a plurality of connection electrodes electrically connected to the circuit board; and a first protective component located between the plurality of connection electrodes.

In one or more embodiments, the connector may include a first opening into which one side of the circuit board is inserted, the first opening enclosing a portion of the circuit board. Each of the connection electrodes and the first protective component enclosing the one side of the circuit board.

In one or more embodiments, the connector may have a closed loop shape enclosing an entirety of the one side of the circuit board.

In one or more embodiments, the connector may have an open loop shape enclosing a portion of the one side of the circuit board without enclosing a remaining portion thereof.

In one or more embodiments, the support component may include: a body configured to support the connector and including a second opening; a plurality of conductive patterns located in the second opening, and electrically connected to the connection electrodes; and a second protective component located in the second opening, the second protective component being located between the plurality of conductive patterns.

In one or more embodiments, the connector and the support component may be integrally provided.

In one or more embodiments, each of the plurality of connection electrodes and each of the conductive patterns may be integrally provided. The first protective component and the second protective component may be integrally provided.

In one or more embodiments, the display device may further include a conductive cable electrically connected to the connector and configured to transmit an electrical signal to the display panel through the connector, and coupled to an end of the body. The conductive cable may be electrically connected to the plurality of conductive patterns through a third opening located at one side surface of the body.

In one or more embodiments, the circuit board may include: a base layer including a first surface and a second surface that are opposite each other; a first electrode on the first surface of the base layer; and a second electrode on the second surface of the base layer. The first electrode and the second electrode may protrude out of the base layer.

In one or more embodiments, each of the first and the second electrodes may be electrically connected to a corresponding connection electrode from among the plurality of connection electrodes.

In one or more embodiments, the first electrodes may include one area bent in an upward direction of the first surface of the base layer. The second electrodes may include one area bent in an upward direction of the second surface of the base layer.

In one or more embodiments, the one area of each of the first and the second electrodes may contact an inner side surface of the corresponding connection electrode.

In one or more embodiments, the circuit board may include: a first sub-base layer at in a center of the first opening, and including a first surface and a second surface that are opposite each other; a first electrode on the first surface of the first sub-base layer; a second electrode on the second surface of the first sub-base layer; a second sub-base layer adjacent to the first surface of the first sub-base layer; a third electrode on the second sub-base layer, and electrically connected to the first electrode and a corresponding connection electrode from among the plurality of connection electrodes; a third sub-base layer adjacent to the second surface of the first sub-base layer; a fourth electrode on the third sub-base layer, and electrically connected to the second electrode and a corresponding connection electrode from among the plurality of connection electrodes; and an elastic component located between the first surface of the first sub-base layer and the second sub-base layer and between the second surface of the first sub-base layer and the third sub-base layer.

In one or more embodiments, the circuit board may include: a base layer including a first surface and a second surface that are opposite each other in one direction, and a third surface and a fourth surface that are opposite each other in a direction intersecting the one direction; a first electrode on the first surface of the base layer, the first electrode being in contact with and electrically connected to a corresponding connection electrode from among the plurality of connection electrodes; a second electrode on the second surface of the base layer, the second electrode being in contact with and electrically connected to a corresponding connection electrode from among the plurality of connection electrodes; a third electrode on the third surface of the base layer, the third electrode being in contact with and electrically connected to a corresponding connection electrode from among the plurality of connection electrodes; and a fourth electrode on the fourth surface of the base layer, the fourth electrode being in contact with and electrically connected to a corresponding connection electrode from among the plurality of connection electrodes.

In one or more embodiments, the circuit board may include: a base layer having a shape corresponding to the first opening; and an electrode located on a surface of the base layer, the electrode being in contact with and electrically connected to a corresponding connection electrode from among the plurality of connection electrodes.

In one or more embodiments, the circuit board may include: a base layer having a shape in which a portion of the first opening is filled with the base layer; and an electrode located on a surface of the base layer, the electrode being in contact with and electrically connected to a corresponding connection electrode from among the plurality of connection electrodes.

In one or more embodiments, the circuit board may include: a base layer at a center of the first opening, and including a protrusion, wherein one side surface of the protrusion protrudes toward the connector; and an electrode located on the protrusion, and electrically connected to a corresponding connection electrode from among the plurality of connection electrodes.

In one or more embodiments, the display panel may be a rollable display panel.

One or more embodiments of the present disclosure may provide a display device including: a display panel; a housing configured to receive the display panel, the housing including a slot at one side surface thereof; a mounting component located at one side of the housing; a rotator located in the housing and configured to wind or deploy the display panel; a circuit board located in the rotator, and electrically connected to the display panel; a structure located in the housing, the structure being adjacent to the rotator and configured to be electrically connected to the circuit board; and a conductive cable connected to the structure and configured to transmit a signal to the circuit board. The structure may include: a connector comprising a plurality of connection electrodes electrically connected to the circuit board, a first protective component located between the plurality of connection electrodes, and a first opening into which one side of the circuit board is inserted; and a support component comprising a body configured to support the connector, the support component including a second opening, a plurality of conductive patterns located in the second opening and electrically connected to the plurality of connection electrodes, and a second protective component located between the plurality of conductive patterns. The connector and the support component may be integrally provided.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
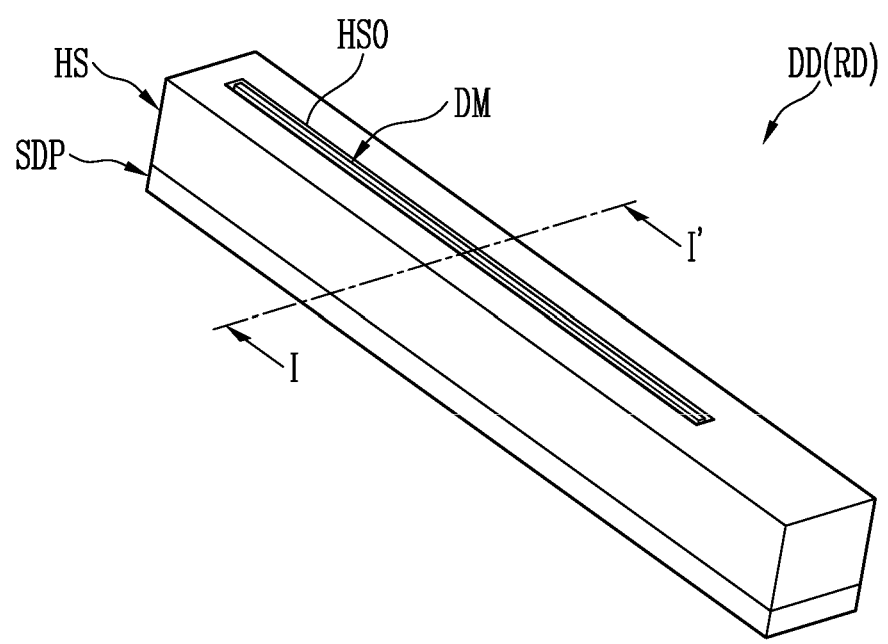
FIG. 1 is a perspective view schematically illustrating a display device in accordance with one or more embodiments.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

Figure 2:
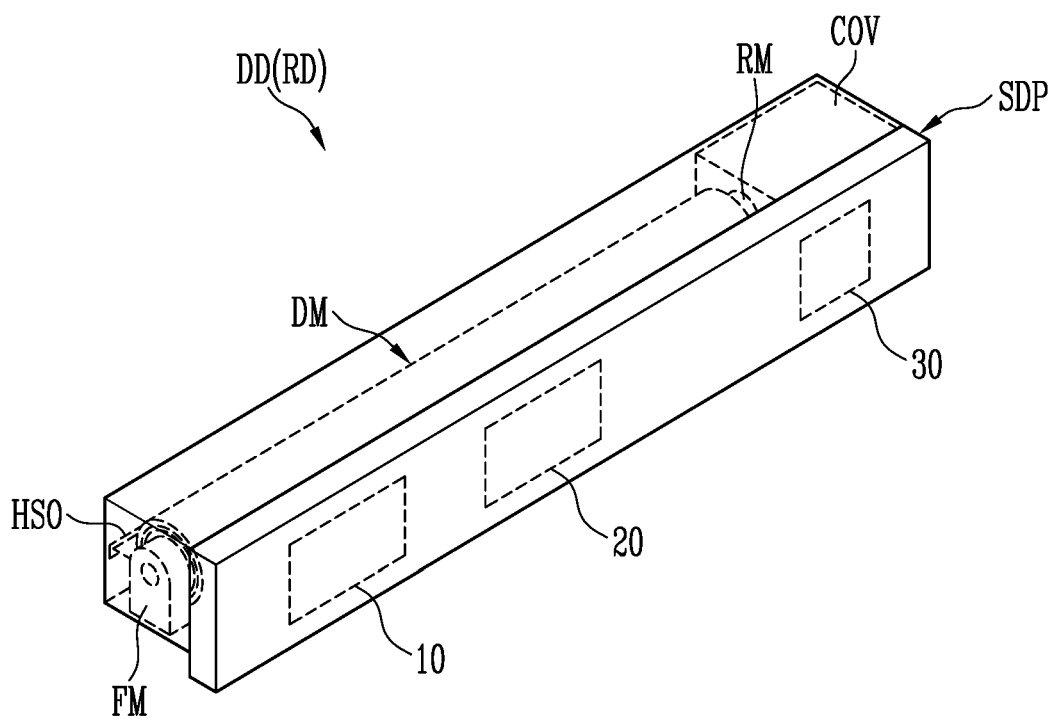
FIG. 2 is a side perspective view schematically illustrating the display device of FIG. 1.
Figure 3:
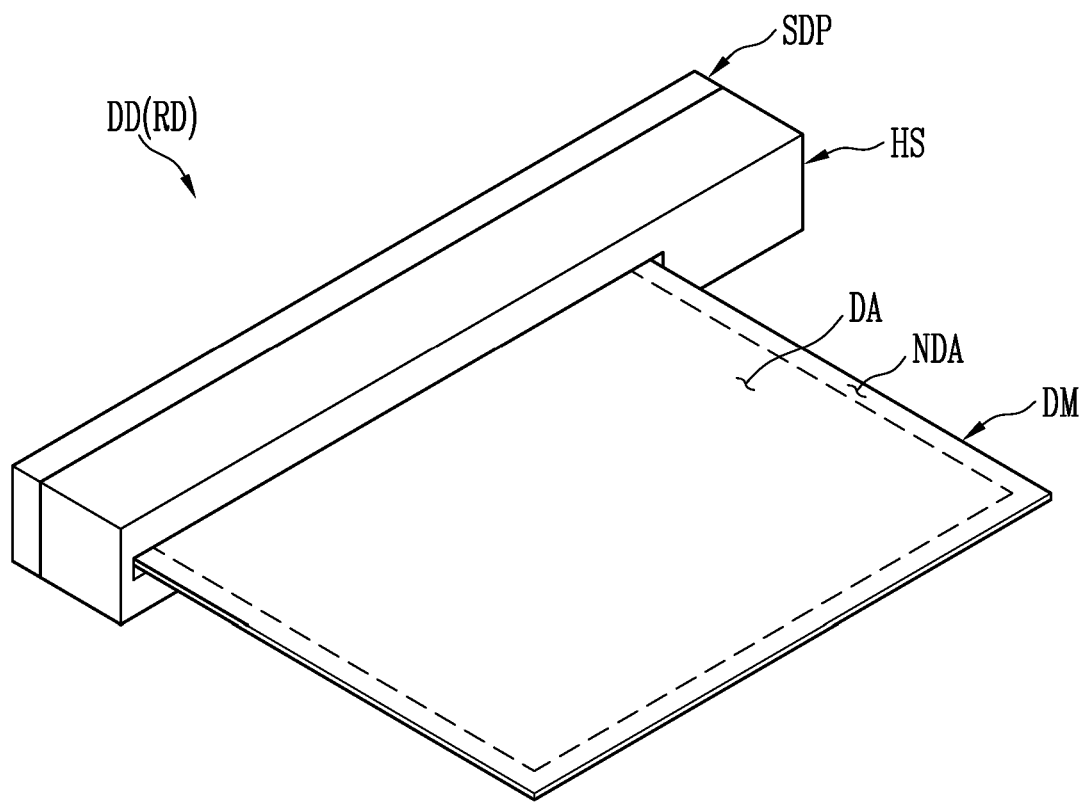
FIG. 3 is a perspective view illustrating a deployed state of a display module in the display device of FIG. 1.
Figure 4:
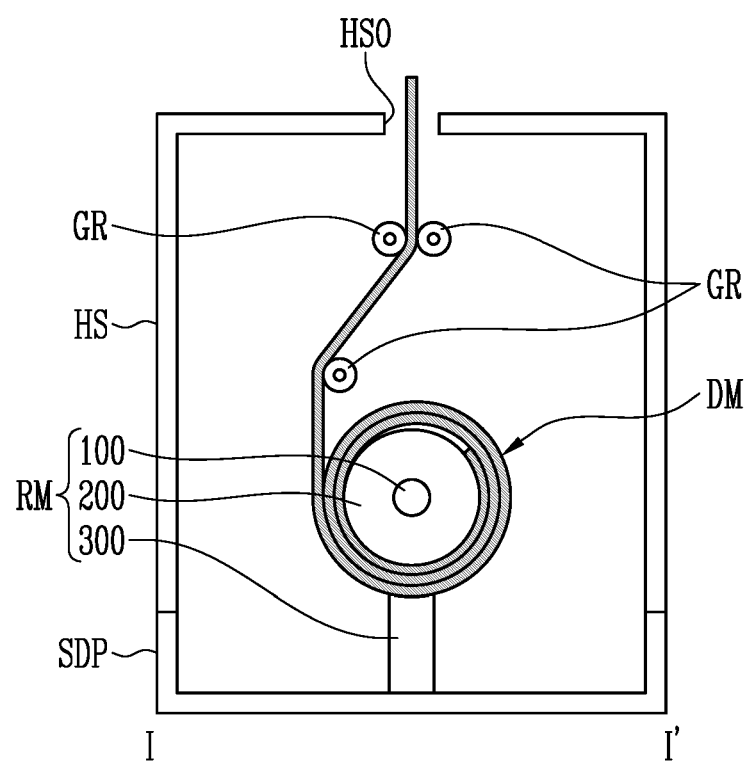
FIG. 4 is a schematic sectional view taken along the line I-I' of FIG. 1.

FIG. 1 is a perspective view schematically illustrating a display device DD in accordance with an embodiment. FIG. 2 is a side perspective view schematically illustrating the display device DD of FIG. 1. FIG. 3 is a perspective view illustrating a deployed state of a display module DM in the display device DD of FIG. 1. FIG. 4 is a schematic sectional view taken along the line I-I' of FIG. 1.

Referring to FIGS. 1 to 4, the display device DD in accordance with one or more embodiments may be a rollable display device RD.

The display device DD may include a housing HS and a mounting component SDP. The display module DM that is wound at a certain curvature may be disposed in the housing HS. The display module DM may be a rollable display module.

The housing HS may be an apparatus that receives the wound display module DM therein, and have in one side surface thereof a slot HSO (or a housing opening) through which the display module DM can pass. A rotator RM may be rotatably installed in the housing HS. The slot HSO of the housing HS may be a passage for winding and deploying (or unwinding) the display module DM. For example, the display module DM may be wound into the housing HS through the slot HSO of the housing HS, or deployed out of the housing HS through the slot HSO. The slot HSO of the housing HS may have a shape corresponding to a cross-sectional shape of the display module DM, but the present disclosure is not limited thereto.

The rotator RM (or referred to as "roller") may wind and/or deploy the display module DM. The rotator RM (or the roller) may be fixed in the housing HS by a fastener FM. The fastener FM may fasten the rotator RM, and may be coupled to a rotating shaft 100 of the rotator RM and configured to rotate the rotating shaft 100. For example, the fastener FM may be coupled to a motor to rotate the rotating shaft 100. The rotator RM may have a cylindrical shape extending in one direction. The display module DM may be wound around an outer surface (e.g., an outer circumferential surface) of the rotator RM.

In one or more embodiments, the rotator RM may include the rotating shaft 100, a rotating cylinder 200, and a roller support 300. The rotating shaft 100 may be disposed in a center (or middle) of the rotating cylinder 200. For example, the rotating shaft 100 may pass through the rotating cylinder 200 and extend in one direction. The roller support 300 may be fastened inside the housing HS and support the rotating shaft 100. In one or more embodiments, the roller support 300 may be omitted. In this case, the rotating shaft 100 may be directly fastened to an inner side surface of the housing HS.

If the rotating shaft 100 rotates in one direction, the display module DM may be wound around the rotating shaft 100. If the rotating shaft 100 rotates in an opposite direction, the display module DM that has been wound may be deployed (or unwound).

A cover COV may be disposed in the housing HS. The cover COV may be disposed to enclose a structure (refer to "STM" of FIG. 13) disposed on one end of the rotator RM and thus protect the structure STM. Detailed description of the structure STM will be made with reference to FIGS. 13 to 21.

The mounting component SDP may be provided on one side of the housing HS. A controller 30 configured to output an image to the display module DM, a power supply 20, a speaker configured to output sound, an input/output terminal configured to input or output various signals, and a radio transceiver configured to wirelessly transmit or receive signals may be provided on the mounting component SDP. Therefore, various control printed circuit boards that form the controller 30, and a power supply printed circuit board that forms the power supply 20 may be installed in the mounting component SDP, but the present disclosure is not limited thereto. A motor controller 10 configured to control the motor may be provided in the mounting component SDP.

The display module DM may be provided in various forms, for example, in the form of a rectangular plate having two pairs of parallel sides, but the present disclosure is not limited thereto. In case that the display module DM is provided in the form of a rectangular plate, any one pair of sides of the two pairs of sides may be longer than the other pair of sides. Although in the drawing the display module DM has an angled corner formed by linear lines, the present disclosure is not limited thereto.

The display module DM may include a display area DA provided to display an image, and a non-display area NDA provided on at least one side of the display area DA (e.g., the non-display area NDA may be around an edge or a periphery of the display area DA). The non-display area NDA may be an area on which no image is displayed.

In one or more embodiments, the display module DM may include a sensing area and a non-sensing area. The display module DM may not only display an image through the sensing area but may also sense a touch input made on a display surface (or an input surface) or sense light that is incident from a certain direction (e.g., the front). The non-sensing area may enclose the sensing are along the edge or the periphery of the sensing area, but this is only for illustrative purposes, and the present disclosure is not limited thereto. In one or more embodiments, a partial area of the display area DA may correspond to the sensing area.

In one or more embodiments, the display device DD may include a plurality of guide rollers GR. The guide rollers GR may guide the display module DM in a movement direction during a process of extracting or drawing out (e.g., finally drawing out) the display module DM. The guide rollers GR may be disposed in the housing HS.

Figure 5:
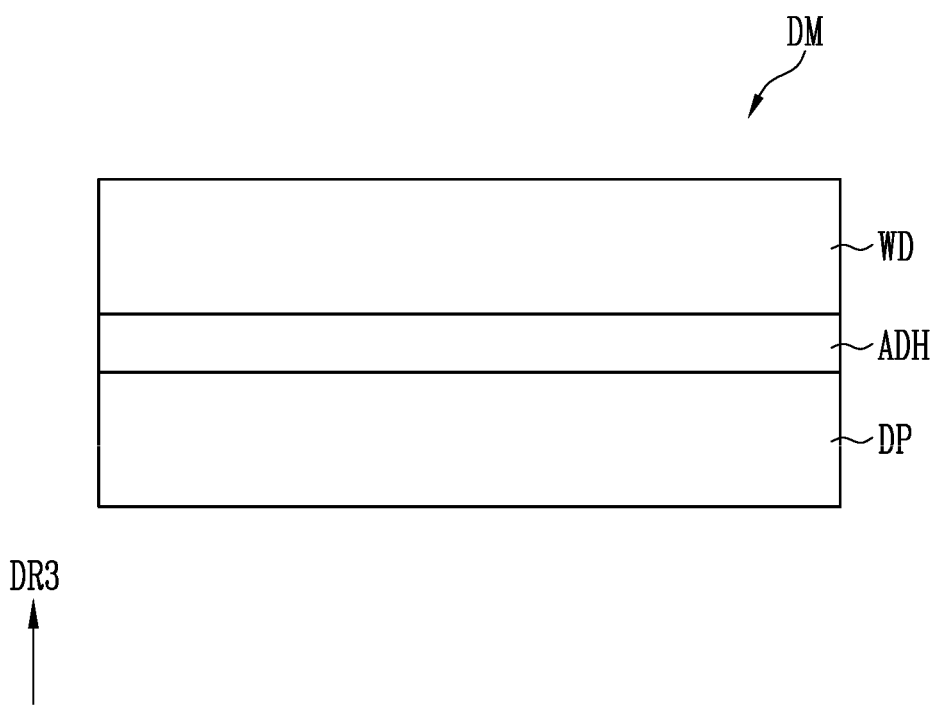
FIG. 5 is a schematic sectional view of the display module in accordance with one or more embodiments.
Figure 6:
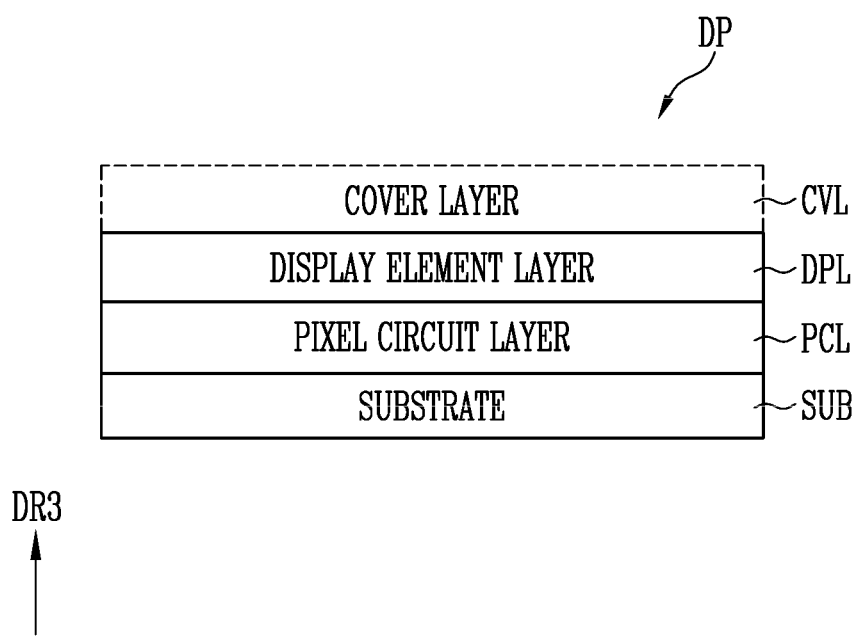
FIG. 6 is a schematic sectional view of a display panel of FIG. 5.

FIG. 5 is a schematic sectional view of the display module DM in accordance with an embodiment. FIG. 6 is a schematic sectional view of a display panel DP of FIG. 5.

In FIGS. 5 and 6, a thickness direction of the display panel DP (or a substrate SUB) is indicated by a third direction DR3.

Referring to FIGS. 1 to 6, the display module DM may include the display panel DP, a window WD, and an adhesive layer ADH.

The display panel DP may display an image. A self-emissive display panel, such as an organic light emitting diode (OLED) display panel (OLED panel) using an organic light emitting diode (OLED) as a light emitting element, a subminiature light emitting diode (nano-LED) display panel using a subminiature LED as a light emitting element, and a quantum dot organic light emitting display panel (QD OLED panel) using a quantum dot and an organic light emitting diode, may be used as the display panel DP. In addition, a non-emissive display panel such as a liquid crystal display (LCD) panel, an electro-phoretic display (EPD) panel, or an electro-wetting display (EWD) panel may be used as the display panel DP. In case that the non-emissive display panel is used as the display panel DP, the display device DD may include a backlight unit configured to supply light to the display panel DP.

The display panel DP may include a substrate SUB, and a pixel circuit layer PCL, a display element layer DPL, and a cover layer CVL which are successively disposed on the substrate SUB.

The substrate SUB may be provided as one area having an approximately rectangular shape. However, the number of areas provided in the substrate SUB may differ from that of the foregoing example. The shape of the substrate SUB may be changed depending on areas provided in the substrate SUB.

The substrate SUB may be made of insulating material such as glass or resin. Furthermore, the substrate SUB may be made of material having flexibility so as to be bendable or foldable, and have a single structure or a multilayer structure. For instance, examples of the material having flexibility may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB is not limited to that of the foregoing embodiments.

The pixel circuit layer PCL may be provided on the substrate SUB, and include a plurality of transistors and signal lines connected to the transistors. For example, each transistor has a structure in which a semiconductor layer, a gate electrode, a first terminal, and a second terminal are successively stacked with insulating layers interposed therebetween. The semiconductor layer may include amorphous silicon, poly silicon, low temperature poly silicon, an organic semiconductor, and an oxide semiconductor. Although the gate electrode, the first terminal, and the second terminal each may include one of aluminum, copper, titanium, and molybdenum, the present disclosure is not limited thereto. In addition, the pixel circuit layer PCL may include at least one or more insulating layers.

The display element layer DPL may be disposed on the pixel circuit layer PCL. The display element layer DPL may include a light emitting element configured to emit light. Although the light emitting element may be, e.g., an organic light emitting diode (OLED), the present disclosure is not limited thereto. In one or more embodiments, the light emitting element may be an inorganic light emitting element including inorganic light emitting material, or a light emitting element that emits light after changing the wavelength of the light to be emitted using quantum dots.

The cover layer CVL may be selectively disposed on the display element layer DPL. The cover layer CVL may be an encapsulation substrate or have the form of an encapsulation layer having a multilayer structure. In case that the cover layer CVL has the form of the encapsulation layer, the cover layer CVL may include an inorganic layer and/or an organic layer. For example, the cover layer CVL may have a structure formed by successively stacking an inorganic layer, an organic layer, and an inorganic layer. The cover layer CVL may prevent external air or water from penetrating the display element layer DPL or the pixel circuit layer PCL.

In one or more embodiments, the cover layer CVL may be formed of thermo- and/or photo-setting resin, and may be applied in a liquid form to the substrate SUB, and then hardened through a curing process using heat and/or light. Here, the cover layer CVL may protect the light emitting element and, concurrently (e.g., simultaneously), more stably fix the light emitting element.

The window WD may be provided on the display panel DP to protect an exposed surface of the display panel DP. The window WD may protect the display panel DP from an external impact, and provide an input surface and/or a display surface to the user. The window WD may be coupled with the display panel DP by the adhesive layer ADH. The adhesive layer ADH may include optically transparent adhesive material.

The window WD may have a multilayer structure including at least one selected from among a glass substrate, a plastic film, and a plastic substrate. The multilayer structure may be formed through a successive process or an adhesion process using an adhesive layer. The window WD may entirely or partially have flexibility.

A touch sensor may be disposed between the display panel DP and the window WD. The touch sensor may be directly disposed on a surface from which an image is displayed, and may be configured to receive a touch input of the user.

Figure 7:
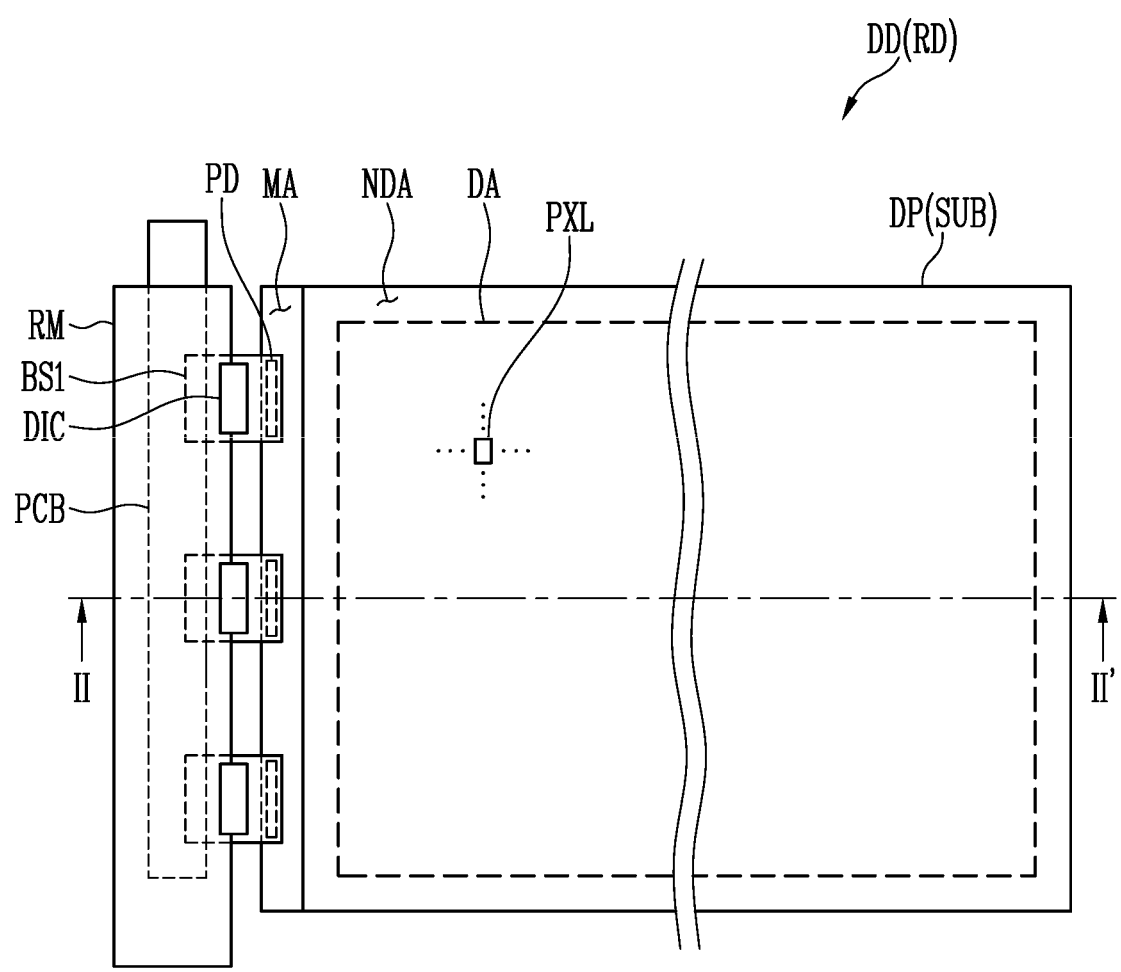
FIG. 7 is a plan view schematically illustrating a portion of the display device in accordance with one or more embodiments.
Figure 8:
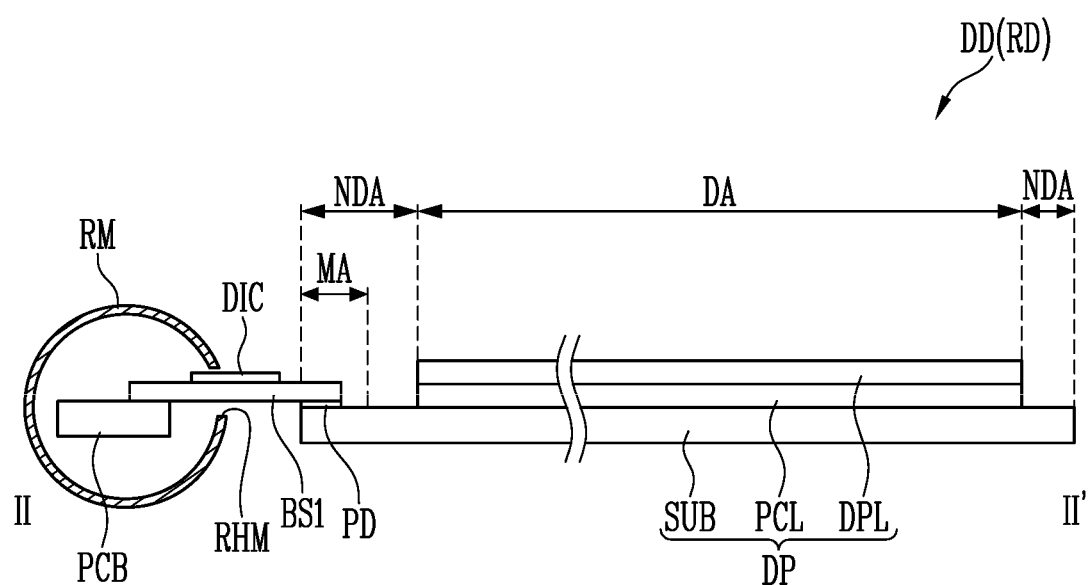
FIG. 8 is a schematic sectional view taken along the line II-II' of FIG. 7.

FIG. 7 is a plan view schematically illustrating a portion of the display device DD in accordance with one or more embodiments. FIG. 8 is a schematic sectional view taken along the line II-II' of FIG. 7.

The description of the embodiment of FIGS. 7 and 8 will be focused on differences from the above-mentioned embodiments so as to avoid redundant description.

Referring to FIGS. 1 to 8, the display device DD may include a display panel DP, a driving integrated circuit DIC, a circuit board PCB, and a rotator RM.

The display panel DP may include a substrate SUB, a pixel circuit layer PCL, and a display element layer DPL (or a display layer). In one or more embodiments, display panel DP may include a cover layer (refer to "CVL" of FIG. 6) disposed on the display element layer DPL.

The display panel DP may include a display area DA and a non-display area NDA around the edge or the periphery of the display area DA. The display area DA may be an area in which the pixels PXL are provided and an image is thus displayed. The non-display area NDA may be an area in which the pixels PXL are not provided, and may be an area in which an image is not displayed.

The non-display area NDA may be provided on at least one side of the display area DA. The non-display area NDA may enclose the perimeter (or edges) of the display area DA. A line component connected to the pixels PXL, and the driving integrated circuit DIC connected to the line component and configured to drive the pixels PXL may be provided in the non-display area NDA. The non-display area NDA may include a mounting area MA to which the circuit board PCB is coupled. For example, the mounting area MA may be one area of the non-display area NDA. A pad component PD including a plurality of pads may be disposed in the mounting area MA. The pad component PD may be physically and/or electrically connected to the driving integrated circuit DIC by a conductive adhesive component. The conductive adhesive component may include an anisotropic conductive film.

The line component may electrically connect the driving integrated circuit DIC with the pixels PXL. The line component may be a fan-out line connected with signal lines, e.g., a scan line, and a data line, which are connected to each pixel PXL to provide signals to the pixel PXL.

The pixels PXL may be provided in the display area DA of the display panel DP (or the substrate SUB). For example, the pixels PXL may be provided on one surface of the substrate SUB disposed in the display area DA. For the sake of explanation, FIG. 7 illustrates only one pixel PXL, but a plurality of pixels PXL may be substantially provided on one surface of the substrate SUB. Each of the pixels PXL refers to a smallest unit for displaying an image. Each of the pixels PXL may include at least one light emitting element that emits white light and/or color light. Each of the pixels PXL may emit any one color of red, green, and blue, but the present disclosure is not limited thereto, and the pixel PXL may emit a color such as cyan, magenta, or yellow.

The pixels PXL may be arranged in a matrix form along rows extending in the first direction DR1 and columns extending in the second direction DR2 intersecting with the first direction DR1. However, the arrangement of the pixels PXL is not limited to a particular arrangement. In other words, the pixels PXL may be arranged in various forms. Although each of the pixels PXL has been illustrated as having a rectangular shape, the present disclosure is not limited thereto. The pixel PXL may have various shapes. Furthermore, in case that a plurality of pixels PXL are provided, the pixels PXL may have different surface areas (or different sizes). For example, in case that pixels PXL emit different colors of light, the pixels PXL may have different surface areas (or different sizes) or different shapes by colors.

The driving integrated circuit DIC may be mounted on the first base layer BS1 (or the first base substrate) and electrically connected to the circuit board PCB and the pad component PD. The driving integrated circuit DIC may receive signals output from the circuit board PCB, and output certain signals, a driving voltage, and the like to be supplied to the pixels PXL based on the received signals. The foregoing certain signals and the driving voltage may be transmitted to the pixels PXL by the pad component PD.

The circuit board PCB may supply image data, a control signal, a power voltage, and the like to the display panel DP. The circuit board PCB may be a flexible wiring substrate or a rigid wiring substrate.

In case that the display panel DP is wound around the rotator RM, the circuit board PCB may be disposed in the rotator RM. The rotator RM may be provided with internal space that receives the circuit board PCB and at least a portion of the first base layer BS1. A coupling slot RHM may be provided in one area of the rotator RM so that the first base layer BS1 may be coupled to the rotator RM through the coupling slot RHM.

Figure 9:
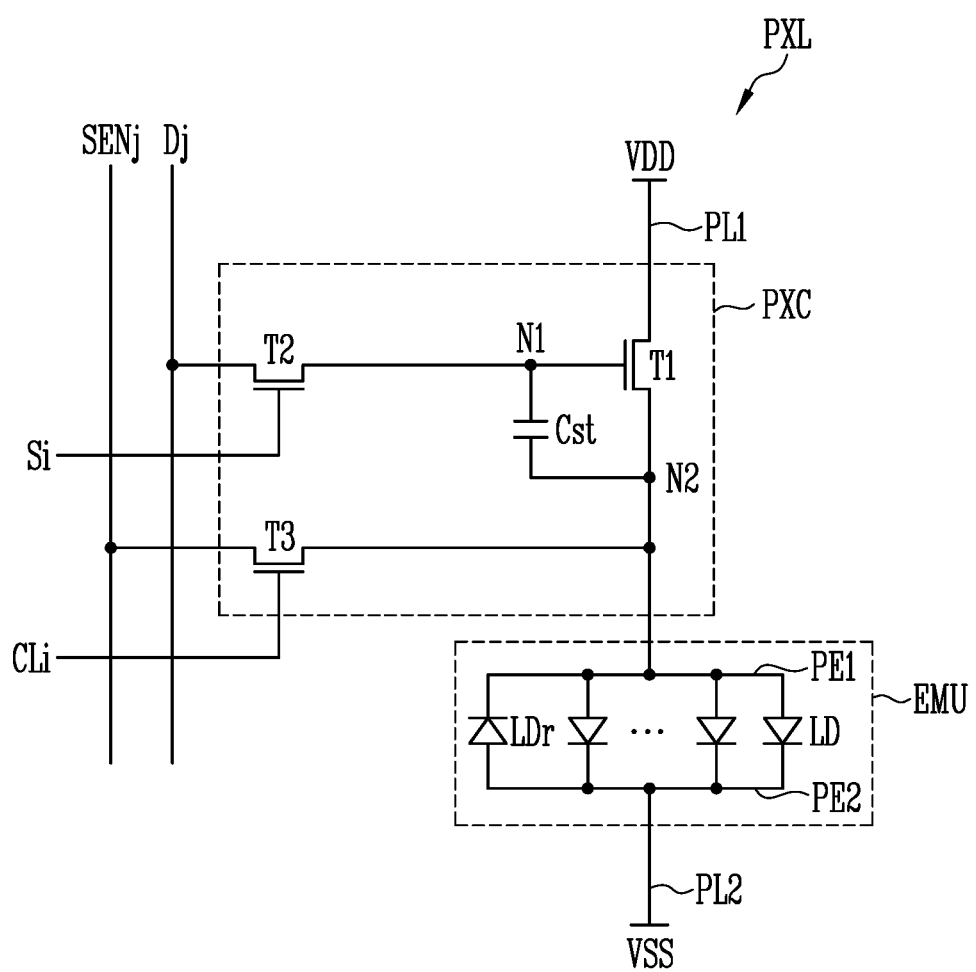
FIG. 9 is a circuit diagram illustrating an electrical connection relationship of components included in a pixel illustrated in FIG. 7.

FIG. 9 is a circuit diagram illustrating an electrical connection relationship of components included in the pixel PXL illustrated in FIG. 7.

For example, FIG. 9 illustrates the electrical connection relationship of components included in the pixel PXL that may be employed in an active matrix type display device. However, the electrical connection relationship between the components included in the pixel PXL that can be applied to embodiments is not limited thereto.

Referring to FIGS. 1 to 9, the pixel PXL may include an emission unit EMU (or an emitter) configured to generate light having a luminance corresponding to a data signal. Furthermore, the pixel PXL may selectively further include a pixel circuit PXC configured to drive the emission unit EMU.

In one or more embodiments, the emission unit EMU may include a plurality of light emitting elements LD connected in parallel between a first power line PL1 which is connected to a first driving power supply VDD and to which a voltage of the first driving power supply VDD is applied, and a second power line PL2 which is connected to a second driving power supply VSS and to which a voltage of the second driving power supply VSS is applied. For example, the emission unit EMU may include a first pixel electrode PE1 connected to the first driving power supply VDD via the pixel circuit PXC and the first power line PL1, a second pixel electrode PE2 connected to the second driving power supply VSS through the second power line PL2, and a plurality of light emitting elements LD connected in parallel to each other in the same direction between the first and second pixel electrodes PE1 and PE2. In one or more embodiments, the first pixel electrode PE1 may be an anode, and the second pixel electrode PE2 may be a cathode.

Each of the light emitting elements LD included in the emission unit EMU may include one end connected to the first driving power supply VDD by the first pixel electrode PE1, and a remaining end connected to the second driving power supply VSS by the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are connected in parallel to each other in the same direction (e.g., in a forward direction) between the first pixel electrode PE1 and the second pixel electrode PE2 to which the voltages of the different power supplies are supplied may form respective valid light sources.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into parts which flow into the respective light emitting elements LD. Hence, each of the light emitting elements LD may emit light having a luminance corresponding to current applied thereto, so that the emission unit EMU may emit light having a luminance corresponding to the driving current.

Although there has been described the embodiment in which the opposite ends of the light emitting elements LD are connected in the same direction between the first and second driving power supplies VDD and VSS, the present disclosure is not limited thereto. In one or more embodiments, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be connected in parallel to each other between the first and second pixel electrodes PE1 and PE1. Here, the reverse light emitting element LDr may be connected between the first and second pixel electrodes PE1 and PE2 in a direction opposite to that of the light emitting elements LD. Even if a certain driving voltage (e.g., a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be connected to a scan line Si and a data line Dj of the pixel PXL. The pixel circuit PXC may be connected to a control line CLi and a sensing line SENj of the pixel PXL. For example, in case that the pixel PXL is disposed on an i-th row and a j-th column of the display area DA, the pixel circuit PXC of the pixel PXL may be connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor configured to control driving current to be applied to the emission unit EMU and may be connected between the first driving power supply VDD and the emission unit EMU. In detail, a first terminal of the first transistor T1 may be connected (or coupled) to the first driving power supply VDD through the first power line PL1. A second terminal of the first transistor T1 may be connected to a second node N2. A gate electrode of the first transistor T1 may be connected to a first node N1. The first transistor T1 may control, in response to a voltage applied to the first node N1, the amount of driving current to be applied from the first driving power supply VDD to the emission unit EMU through the second node N2. In one or more embodiments, the first terminal of the first transistor T1 may be a drain electrode, and the second terminal of the first transistor T1 may be a source electrode, but the present disclosure is not limited thereto. In one or more embodiments, the first terminal may be a source electrode, and the second terminal may be a drain electrode.

The second transistor T2 may be a switching transistor that selects a pixel PXL in response to a scan signal and activates the pixel PXL, and may be connected between the data line Dj and the first node N1. A first terminal of the second transistor T2 may be connected to the data line Dj. A second terminal of the second transistor T2 may be connected to the first node N1. A gate electrode of the second transistor T2 may be connected to the scan line Si. The first terminal and the second terminal of the second transistor T2 are different terminals, and, for example, if the first terminal is a drain electrode, and the second terminal is a source electrode.

When a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are connected to each other. The second transistor T2 may transmit a data signal to the gate electrode of the first transistor T1.

The third transistor T3 may obtain a sensing signal through the sensing line SENj by connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the third transistor T3 may be connected to the second terminal of the first transistor T1. A first terminal of the third transistor T3 may be connected to the sensing line SENj. A gate electrode of the third transistor T3 may be connected to the control line CLi. Furthermore, in one or more embodiments, the first terminal of the third transistor T3 may be connected to an initialization power supply. The third transistor T3 may be an initialization transistor configured to initialize the second node N2, and may be turned on when a sensing control signal is supplied thereto from the control line CLi, so that the voltage of the initialization power supply can be transmitted to the second node N2. Hence, a second storage electrode of the storage capacitor Cst connected to the second node N2 may be initialized.

A first storage electrode of the storage capacitor Cst may be connected to the first node N1. A second storage electrode of the storage capacitor Cst may be connected to the second node N2. The storage capacitor Cst may be charged with a data voltage corresponding to a data signal to be supplied to the first node N1 during one frame period. Hence, the storage capacitor Cst may store a voltage (or charge) corresponding to a difference between a voltage of the gate electrode of the first transistor T1 (i.e., the first node N1) and a voltage of the second node N2.

Although FIG. 9 illustrates an embodiment in which all of the light emitting elements LD that form the emission unit EMU are connected in parallel to each other, the present disclosure is not limited thereto. In one or more embodiments, the emission unit EMU may include at least one serial set (or stage) including a plurality of light emitting elements LD connected in parallel to each other. In other words, the emission unit EMU may be formed of a serial/parallel combination structure.

Figure 10:
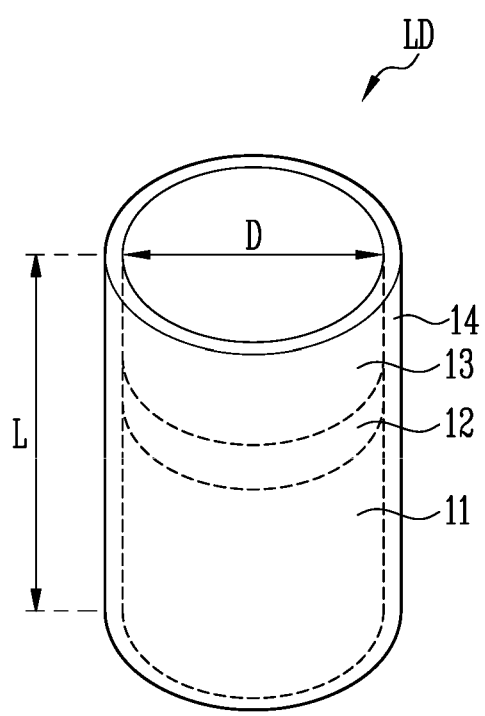
FIG. 10 is a perspective view schematically illustrating a light emitting element of FIG. 9.

FIG. 10 is a perspective view schematically illustrating a light emitting element LD of FIG. 9.

In one or more embodiments, the type and/or shape of the light emitting element LD is not limited to that of the embodiment illustrated in FIG. 10.

Referring to FIGS. 9 and 10, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stack pattern") formed by successively stacking the first semiconductor layer 11, the active layer 12, and the second semiconductor layer 13.

The light emitting element LD may be formed in a shape extending in one direction. If the direction in which the light emitting element LD extends is defined as a longitudinal direction, the light emitting element LD may have a first end and a second end in the longitudinal direction. One semiconductor layer of the first semiconductor layer 11 and the second semiconductor layer 13 may be disposed on the first end of the light emitting element LD, and the other semiconductor layer of the first semiconductor layer 11 and the second semiconductor layer 13 may be disposed on the second end of the light emitting element LD. For example, the second semiconductor layer 13 may be disposed on the first end of the light emitting element LD, and the first semiconductor layer 11 may be disposed on the second end of the light emitting element LD.

The light emitting element LD may have various shapes. For example, as illustrated in FIG. 10, the light emitting element LD may have a rod-like shape, a bar-like shape, or a pillar-like shape that is long with respect to the longitudinal direction (i.e., to have an aspect ratio greater than 1). Alternatively, the light emitting element LD may have a rod-like shape, a bar-like shape, or a pillar-like shape which is short with respect to the longitudinal direction (or has an aspect ratio less than 1). As a further alternative, the light emitting element LD may have a rod-like shape, a bar-like shape, or a pillar-like shape having an aspect ratio of 1.

The light emitting element LD may include a light emitting diode (LED) fabricated to have a subminiature size, e.g., with a diameter D and/or a length L corresponding to a range from the nano scale (or the nanometer scale) to the micro scale (or the micrometer scale).

In case that the light emitting element LD is long (i.e., to have an aspect ratio greater than 1) with respect to the longitudinal direction, the diameter D of the light emitting element LD may approximately range from 0.5 μm to 6 μm, and the length L thereof may approximately range from 1 μm to 10 μm. However, the diameter D and the length L of the light emitting element LD are not limited thereto. The size of the light emitting element LD may be changed to meet requirements (or design conditions) of a lighting device or a self-emissive display device DD to which the light emitting element LD is applied.

The first semiconductor layer 11 may include, for example, at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and various other materials may be used to form the first conductive semiconductor layer 11. The first semiconductor layer 11 may include, with respect to the longitudinal direction of the light emitting element LD, an upper surface that contacts the active layer 12, and a lower surface exposed to the outside.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer that are provided as one unit. The stain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from 400 nm to 900 nm, and have a double hetero structure. In one or more embodiments, a clad layer doped with a conductive dopant may be formed over and/or under the active layer 12 with respect to the longitudinal direction of the light emitting element LD. For example, the clad layer may be formed of an AlGaN layer or an InAlGaN layer. In one or more embodiments, material such as AlGaN or InAlGaN may be used to form the active layer 12, and various other materials may be used to form the active layer 12. The active layer 12 may include a first surface that contacts the first semiconductor layer 11, and a second surface that contacts the second semiconductor layer 13.

If an electric field having a certain voltage or more is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (e.g., a light emitting source) of various light emitting devices as well as a pixel of a display device DD.

The second semiconductor layer 13 may be disposed on the second surface of the active layer 12 and include a semiconductor layer of a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13. The second semiconductor layer 13 may include, with regard to the longitudinal direction of the light emitting element LD, a lower surface that contacts the second surface of the active layer 12, and an upper surface exposed to the outside.

In one or more embodiments, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each is formed of a single layer, the present disclosure is not limited thereto. In one or more embodiments, depending on the material of the active layer 12, the first semiconductor layer 11, and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer can function as a buffer layer to reduce a difference in lattice constant. Although the TSBR layer may be formed of a p-type semiconductor layer such as p-GaInP, p-AlInP, or p-AlGaInP, the present disclosure is not limited thereto.

In one or more embodiments, the light emitting element LD may further include a contact electrode (hereinafter referred to as "first contact electrode") disposed over the second semiconductor layer 13, as well as including the first semiconductor layer 11, the active layer 12, and the second semiconductor layer 13. Furthermore, in one or more embodiments, the light emitting element LD may further include another contact electrode (hereinafter referred to as "second contact electrode") disposed on one end of the first semiconductor layer 11.

Each of the first and second contact electrodes may be an ohmic contact electrode, but the present disclosure is not limited thereto. In one or more embodiments, each of the first and second contact electrodes may be a Schottky contact electrode. The first and second contact electrodes may include conductive material. For example, the first and second contact electrodes may include opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). The zinc oxide ($ZnO_x$) may be zinc oxide (ZnO) and/or zinc peroxide ($ZnO_2$).

Materials included in the first and second contact electrodes may be equal to or different from each other. The first and second contact electrodes may be substantially transparent or translucent. Therefore, light generated from the light emitting element LD may pass through the first and second contact electrodes and then may be emitted outside the light emitting element LD. In one or more embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In one or more embodiments, the light emitting element LD may further include an insulating layer 14 (or referred to as "insulating film"). However, in one or more embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with conductive material except the first and second semiconductor layers 11 and 13. Furthermore, the insulating layer 14 may reduce or minimize a surface defect of the light emitting element LD, thus enhancing the lifetime and emission efficiency of the light emitting element LD. In case that a plurality of light emitting elements LD are disposed in close contact with each other, the insulating layer 14 may prevent an undesired short-circuit from occurring between the light emitting elements LD. The presence or non-presence of the insulating layer 14 is not limited, so long as the active layer 12 can be prevented from short-circuiting with external conductive material.

The insulating layer 14 may be provided to enclose an overall outer surface (e.g., an outer peripheral or circumferential surface) of the emission stack including the first semiconductor layer 11, the active layer 12, and the second semiconductor layer 13.

Although in the foregoing embodiment the insulating layer 14 has been described as enclosing the entirety of the respective outer surfaces (e.g., outer peripheral or circumferential surfaces) of the first semiconductor layer 11, the active layer 12, and the second semiconductor layer 13, the present disclosure is not limited thereto. In one or more embodiments, in case that the light emitting element LD includes the first contact electrode, the insulating layer 14 may enclose the entirety of the respective outer surfaces (e.g., outer peripheral or circumferential surfaces) of the first semiconductor layer 11, the active layer 12, the second semiconductor layer 13, and the first contact electrode. In one or more embodiments, the insulating layer 14 may not enclose the entirety of the outer surface (e.g., the outer peripheral or circumferential surface) of the first semiconductor layer 11, or may enclose only a portion of the outer surface (e.g., the outer peripheral or circumferential surface) of the first semiconductor layer 11 without enclosing the other portion of the outer surface (e.g., the outer peripheral or circumferential surface) of the first semiconductor layer 11. Furthermore, in one or more embodiments, in case that the first contact electrode is disposed on one end (or an upper end) of the light emitting element LD and the second contact electrode is disposed on a remaining end (or a lower end) of the light emitting element LD, the insulating layer 14 may allow at least one area of each of the first and second contact electrodes to be exposed.

The insulating layer 14 may include transparent insulating material. The insulating layer 14 may be provided in the form of a single layer or in the form of multiple layers including double layers. For example, in case that the insulating layer 14 is formed of a double layer structure including a first insulating layer and a second insulating layer that are successively stacked, the first insulating layer and the second insulating layer may be made of different materials (or substances) and may be formed through different processes. In one or more embodiments, the first insulating layer and the second insulating layer may include the same material and may be formed through a successive process.

The light emitting element LD may be employed as a light emitting source (or a light source) of the display device DD. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting elements LD can be evenly distributed rather than unevenly aggregating in the solution.

An emission unit (or a light emitting device) including the light emitting element LD described above may be used not only in the display device DD but also in various types of electronic devices each of which requires a light source. For instance, in case that a plurality of light emitting elements LD are disposed in the emission area of each pixel PXL of the display panel DP, the light emitting elements LD may be used as a light source of the pixel PXL. However, the application field of the light emitting element LD is not limited to the above-mentioned examples. For example, the light emitting element LD may also be used in other types of electronic devices such as a lighting device, which requires a light source.

Hereinafter, an embodiment of the pixel PXL using the above-mentioned light emitting element LD as a light source will be described with reference to FIGS. 11 and 12.

Figure 11:
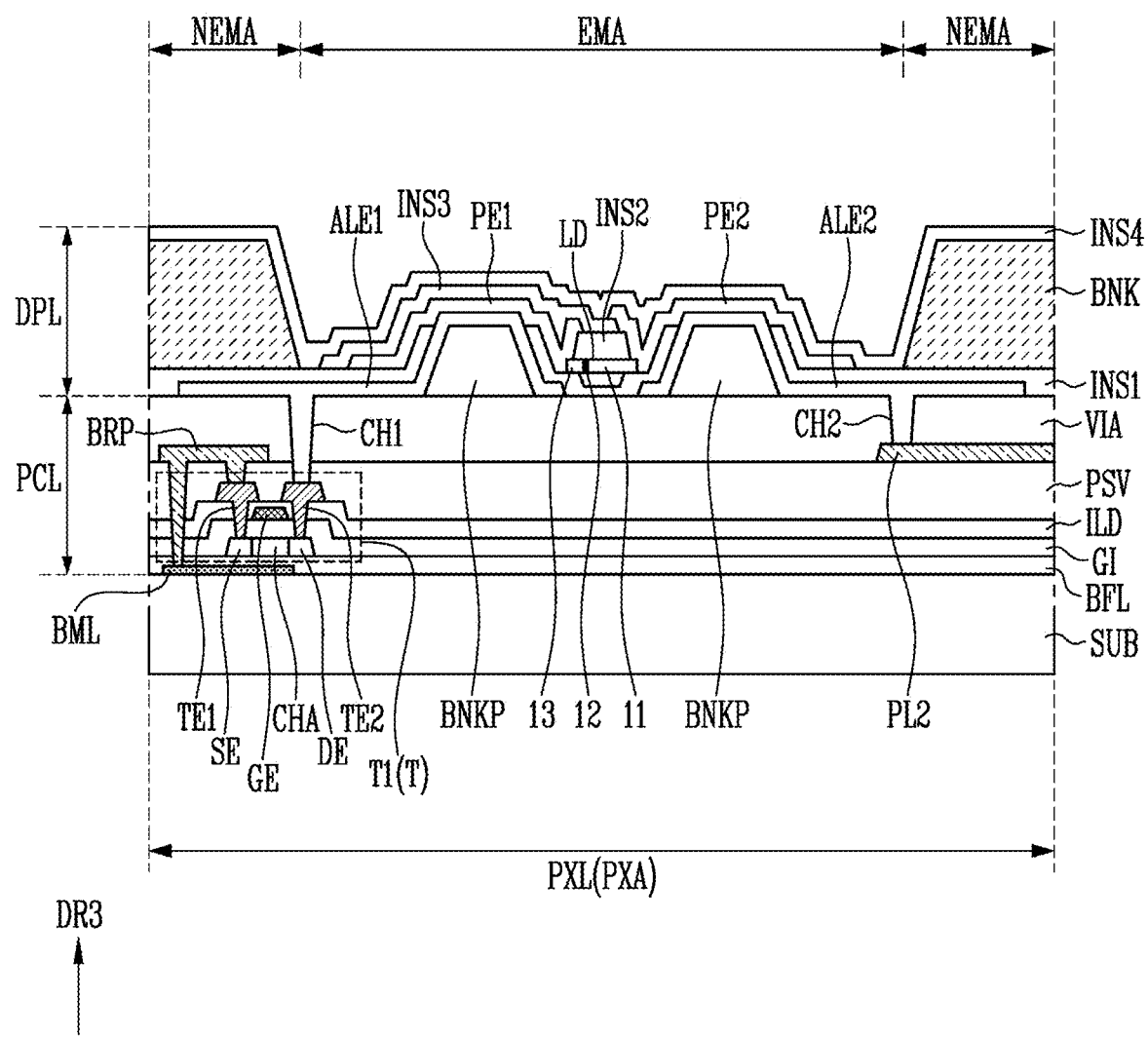
FIGS. 11 and 12 are sectional views schematically illustrating an embodiment of a pixel included in the display device in accordance with one or more embodiments.
Figure 12:
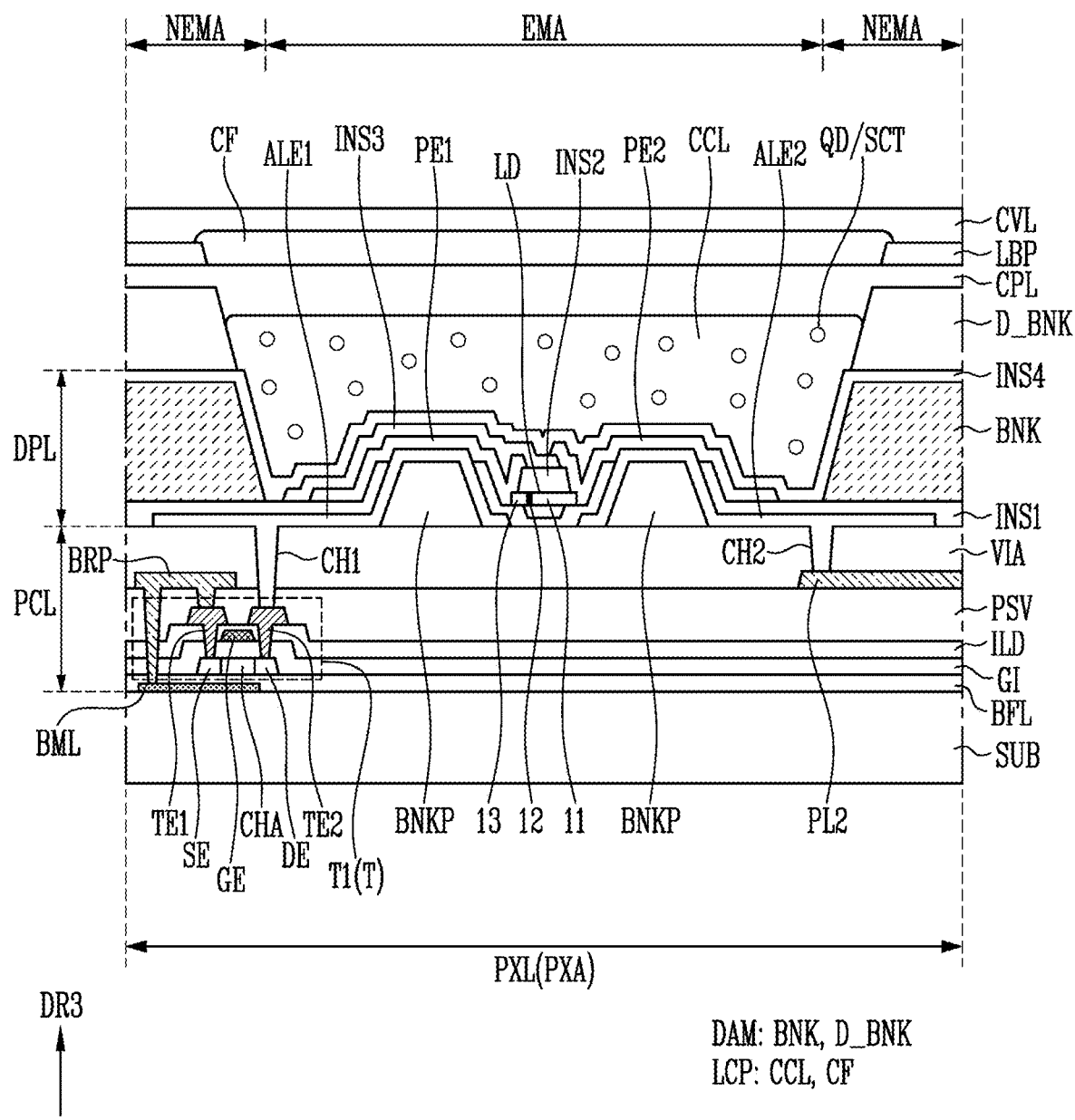

FIGS. 11 and 12 are sectional views schematically illustrating an embodiment of the pixel PXL included in the display device PXL in accordance with one or more embodiments.

FIG. 12 illustrates a modification of the embodiment of FIG. 11 with regard to a color conversion layer CCL, a color filter CF, and the like.

Although FIGS. 11 and 12 simply illustrate a pixel PXL, e.g., illustrating that each electrode is formed of an electrode having a single-layer (or single-film) structure and each insulating layer is formed of an insulating layer having a single layer (or single film) structure, the present disclosure is not limited thereto.

In FIGS. 11 and 12, a vertical direction in a sectional view is illustrated as the third direction DR3.

For the convenience sake, FIGS. 11 and 12 illustrate, as an example, the first transistor T1 corresponding to the driving transistor T among the first to third transistors T1, T2, and T3 illustrated in FIG. 9.

Referring to FIGS. 1 to 12, the pixel PXL may include a substrate SUB, a pixel circuit layer PCL, and a display element layer DPL. The pixel circuit layer PCL and the display element layer DPL may be disposed on one surface of the substrate SUB and overlap each other in the third direction DR3.

The substrate SUB may include transparent insulating material to allow light transmission. The substrate SUB may be a rigid substrate or a flexible substrate.

In a pixel area PXA in which the pixel PXL is disposed, circuit elements (e.g., transistors T) for forming the pixel circuit PXC of the corresponding pixel PXL and signal lines electrically connected to the circuit elements may be disposed. Furthermore, the light emitting element LD and the first and second pixel electrodes PE1 and PE2 that form the emission unit EMU of the corresponding pixel PXL may be disposed in the pixel area PXA. In one or more embodiments, the pixel area PXA may include an emission area EMA and a non-emission area NEMA.

The pixel circuit layer PCL may include at least one or more insulating layers as well as including the circuit elements and the signal lines. For example, the pixel circuit layer PCL may include a buffer layer BFL, a gate insulating layer GI, an interlayer insulating layer ILD, a passivation layer PSV, and a via layer VIA that are successively stacked on the substrate SUB in the third direction DR3. In addition, the pixel circuit layer PCL may include conductive layers disposed between the foregoing insulating layers.

A bottom line layer BML may be disposed on the substrate SUB. The buffer layer BFL may be provided and/or formed on the overall surface of the substrate SUB and the bottom line layer BML. The buffer layer BFL may prevent impurities from diffusing into a transistor T included in the pixel circuit PXC. The buffer layer BFL may be an inorganic insulating layer formed of inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single layer structure or a multilayer structure having at least two or more layers. In case that the buffer layer BFL has a multilayer structure, the respective layers may be formed of the same material or different materials. The buffer layer BFL may be omitted depending on the material of the substrate SUB or processing conditions.

A transistor T, a bridge pattern BRP, and a power line may be disposed on the buffer layer BFL.

The transistor T may include the first transistor T1 configured to control driving current of the light emitting element LD.

The first transistor T1 may include an active pattern (or a semiconductor layer), and a gate electrode GE that overlaps a portion of the active pattern in the third direction DR3. The active pattern may be disposed on the buffer layer BFL and may include a channel area CHA, a first contact area SE, and a second contact area DE.

A gate insulating layer GI may be disposed on the buffer layer BFL and the active pattern. The gate electrode GE may be provided and/or formed on the gate insulating layer GI. The gate electrode GE may have a single layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double layer or multilayer structure formed of molybdenum (Mo), titanium (Ti), copper (Cu), aluminum (Al), or silver (Ag) to reduce line resistance.

The gate insulating layer GI may be provided and/or formed on the overall surfaces of the active pattern and the buffer layer BFL. The gate insulating layer GI may be an inorganic insulating layer including inorganic material. For example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to that of the foregoing embodiments. In one or more embodiments, the gate insulating layer GI may be formed of an organic insulating layer including organic material. Although the gate insulating layer GI may be provided in the form of a single layer structure, the gate insulating layer GI may be provided in the form of a multilayer structure having at least two or more layers.

The active pattern may be formed of poly silicon, amorphous silicon, an oxide semiconductor, or the like. The channel area CHA, the first contact area SE, and the second contact area DE each may be formed of an undoped semiconductor layer or a semiconductor layer doped with an dopant. For example, each of the first contact area SE and the second contact area DE may be formed of a semiconductor layer doped with a dopant. The channel area CHA may be formed of an undoped semiconductor layer.

The channel area CHA of the first transistor T1 may be one area of the active pattern that overlaps the gate electrode GE of the corresponding transistor T in the third direction DR3. For example, the channel area CHA of the first transistor T1 may be one area of the active pattern that overlaps the gate electrode GE of the first transistor T1.

The first contact area SE of the first transistor T1 may be connected to (or brought into contact with) one end of the channel area CHA. The first contact area SE of the first transistor T1 may be connected to a first connection component TE1.

The first connection component TE1 may be provided and/or formed on the interlayer insulating layer ILD. The first connection component TE1 may be electrically and/or physically connected to the first contact area SE of the first transistor T1 through a contact hole successively passing through the interlayer insulating layer ILD and the gate insulating layer GI. In one or more embodiments, the first connection component TE1 that is connected with the first contact area SE of the first transistor T1 may be electrically and/or physically connected to the bridge pattern BRP through a contact hole passing through the passivation layer PSV disposed on the interlayer insulating layer ILD.

The first connection component TE1 may include the same material as that of the gate electrode GE, or include one or more materials selected from among materials exemplified as the constituent material of the gate electrode GE.

The interlayer insulating layer ILD may be provided and/or formed on the overall surfaces of the gate electrode GE and the gate insulating layer GI. The interlayer insulating layer ILD may include the same material as that of the gate insulating layer GI, or may include one or more materials selected from among materials exemplified as the constituent material of the gate insulating layer GI.

The bridge pattern BRP may be provided and/or formed on the passivation layer PSV. The bridge pattern BRP may be connected to the first contact area SE of the first transistor T1 by the first connection component TE1. Furthermore, the bridge pattern BRP may be electrically and/or physically connected with the bottom line layer BML through a contact hole that successively passes through the passivation layer PSV, the interlayer insulating layer ILD, the gate insulating layer GI, and the buffer layer BFL. The bottom line layer BML and the first contact area SE of the first transistor T1 may be electrically connected to each other by the bridge pattern BRP and the first connection component TE1.

The bottom line layer BML may be a first conductive layer of the conductive layers provided on the substrate SUB. The bottom line layer BML may be electrically connected to the first transistor T1 and thus increase a driving range of a certain voltage to be supplied to the gate electrode GE of the first transistor T1. For example, the bottom line layer BML may be electrically connected to the first contact area SE of the first transistor T1 and stabilize the channel area of the first transistor T1. Furthermore, the bottom line layer BML may be electrically connected to the first contact area SE of the first transistor T1, thus preventing the bottom line layer BML from floating.

The second contact area DE of the first transistor T2 may be connected to (or brought into contact with) a remaining end of the channel area CHA of the corresponding transistor T. Furthermore, the second contact area DE of the first transistor T1 may be connected to (or brought into contact with) a second connection component TE2.

The second connection component TE2 may be provided and/or formed on the interlayer insulating layer ILD. The second connection component TE2 may be electrically and/or physically connected to the second contact area DE of the first transistor T1 through a contact hole passing through the interlayer insulating layer ILD and the gate insulating layer GI.

Although in the foregoing embodiment there has been illustrated the case where the first transistor T1 is a thin-film transistor having a top gate structure, the present disclosure is not limited thereto. The structure of the first transistor T1 may be changed in various ways.

The power line may include the second power line PL2. The second power line PL2 may be provided and/or formed on the passivation layer PSV. The second power line PL2 may be provided on (or at) the same layer as that of the bridge pattern BRP. However, the present disclosure is not limited thereto, and the location of the second power line PL2 in the pixel circuit layer PCL may be changed in various ways. A voltage of the second driving power supply VSS described with reference to FIG. 9 may be applied to the second power line PL2. The second power line PL2 may include conductive material (or substance). For example, the second power line PL2 may have a single layer (or single film) structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double layer (or double film) or multilayer (or multi-film) structure formed of molybdenum (Mo), titanium (Ti), copper (Cu), aluminum (Al), or silver (Ag) which is low resistance material to reduce line resistance. For instance, the second power line PL2 may be formed of a double layer (or double film) structure formed by stacking layers in a sequence of titanium (Ti) and copper (Cu).

In one or more embodiments, the pixel circuit layer PCL may further include the first power line PL1 described with reference to FIG. 9. A voltage of the first driving power supply VDD described with reference to FIG. 9 may be applied to the first power line PL1.

The via layer VIA may be provided and/or formed on the bridge pattern BRP and the second power line PL2.

The via layer VIA may be provided in the form of an organic insulating layer, an inorganic insulating layer, or a structure including an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

The via layer VIA may include a first contact hole CH1 that corresponds to the first contact hole CH1 of the passivation layer PSV that exposes the second connection component TE2 electrically connected with the first transistor T1. Furthermore, the via layer VIA may include a second contact hole CH2 that exposes a portion of the second power line PL2.

The display element layer DPL may be provided and/or formed on the via layer VIA (or the pixel circuit layer PCL).

The display element layer DPL may include a bank pattern BNKP, a bank BNK, first and second alignment electrodes ALE1 and ALE2, first and second pixel electrodes PE1 and PE2, first to fourth insulating layers INS1, INS2, INS3, and INS4. Here, the light emitting element LD may have the same configuration as that of each light emitting element LD described with reference to FIG. 10, and may substitute for each of the plurality of light emitting elements LD.

The bank pattern BNKP may be provided and/or formed on the via layer VIA, and disposed in the emission area EMA of the pixel PXL from which light is emitted. The bank pattern BNKP may support each of the first and second alignment electrodes ALE1 and ALE2 to change a surface profile (or a surface shape) of each of the first and second alignment electrodes ALE1 and ALE2 so that light emitted from the light emitting element LD can be guided in an image display direction of the display panel DP (or the display device DD). The bank pattern BNKP may include an inorganic insulating layer including inorganic material or an organic insulating layer including organic material. In one or more embodiments, the bank pattern BNKP may include an organic insulating layer having a single layer structure and/or an inorganic insulating layer having a single layer structure, but the present disclosure is not limited thereto. In one or more embodiments, the bank pattern BNKP may be provided in the form of a multilayer structure formed by stacking at least one organic insulating layer and at least one inorganic insulating layer. However, the material of the bank pattern BNKP is not limited to the foregoing embodiment. In one or more embodiments, the bank pattern BNKP may include conductive material.

The bank BNK (or a first bank) may enclose at least one side of the peripheral area (e.g., the non-emission area NEMA from which light is not emitted) of the pixel PXL. During a process of supplying the light emitting element LD to the pixel PXL, the bank BNK may function as a pixel defining layer or a dam structure for defining the emission area EMA to which the light emitting element LD is to be supplied. For example, because the emission area EMA of the pixel PXL is defined by the bank BNK, a mixed solution (e.g., ink) including a desired amount and/or type of light emitting elements LD may be supplied (or input) to the emission area EMA. The bank BNK may include at least one light block material and/or reflective material, thus preventing a light leakage defect in which light (or rays) leaks between the pixel PXL and the pixels PXL adjacent thereto. In one or more embodiments, the bank BNK may include transparent material (or substance). The transparent material may include, for example, polyamides resin, polyim ides resin, etc., but the present disclosure is not limited thereto. In one or more embodiments, in order to enhance the efficiency of light emitted from the pixel PXL, a separate reflective material layer may be provided and/or formed on the bank BNK.

Each of the first and second alignment electrodes ALE1 and ALE2 may be provided and/or formed on the bank pattern BNKP and have a surface profile corresponding to the shape of the bank pattern BNKP. Each of the first and second alignment electrodes ALE1 and ALE2 may be formed of material having a certain reflectivity to guide light emitted from the light emitting element LD in the image display direction of the display panel DP (or the display device DD). For example, the first alignment electrode ALE1 and the second alignment electrode ALE2 each may be formed of conductive material (or substance) having a certain reflectivity. The conductive material (or substance) may include opaque metal that is suitable for reflecting, in the image display direction of the display panel DP (or the display device DD), light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. In one or more embodiments, each of the first alignment electrode ALE1 and the second alignment electrode ALE2 may be formed of transparent conductive material (or substance). In case that the first alignment electrode ALE1 and the second alignment electrode ALE2 each include transparent conductive material (or substance), a separate conductive layer formed of opaque metal for reflecting light emitted from the light emitting element LD in the image display direction of the display panel DP (or the display device DD) may be added. However, the material of the first alignment electrode ALE1 and the second alignment electrode ALE2 are not limited to the foregoing materials.

The first alignment electrode ALE1 may be electrically connected with the first transistor T1 through the second connection component TE2 and the first contact hole CH1 passing through the via layer VIA and the passivation layer PSV. The second alignment electrode ALE2 may be electrically connected with the second power line PL2 through the second contact hole CH2 passing through the via layer VIA.

The light emitting element LD may be disposed between the first alignment electrode ALE1 and the second alignment electrode ALE2 and electrically connected with each of the first and second alignment electrodes ALE1 and ALE2. The light emitting element LD may emit any one light of color light and/or white light. The light emitting elements LD may be provided in a diffused shape in the mixed solution and input into the pixel PXL. Each of the light emitting elements LD may include a light emitting stacked pattern formed by stacking the first semiconductor layer 11, the active layer 12, and the second semiconductor layer 13 in the listed order in one direction. Furthermore, the light emitting element LD may include an insulating film (e.g., insulating film 14 of FIG. 10) that encloses an outer surface (e.g., an outer peripheral or circumferential surface) of the light emitting stacked pattern.

The light emitting elements LD may be mixed with a volatile solvent and then input (or supplied) to the pixel area PXA by an inkjet printing scheme or a slit coating scheme. Here, if the first alignment electrode ALE1 and the second alignment electrode ALE2 are respectively supplied with corresponding alignment signals, an electric field may be formed between the first alignment electrode ALE1 and the second alignment electrode ALE2. Consequently, the light emitting elements LD may be aligned between the first alignment electrode ALE1 and the second alignment electrode ALE2.

The light emitting element LD may be provided and/or formed on the first insulating layer INS1.

The first insulating layer INS1 may be disposed between and over each of the first and second alignment electrodes ALE1 and ALE2 and the via layer VIA. The first insulating layer INS1 may be charged into space between the light emitting element LD and the via layer VIA, thus reliably supporting the light emitting element LD. The first insulating layer INS1 may be formed of an inorganic insulating layer including inorganic material, or an organic insulating layer including organic material. The first insulating layer INS1 may be partially open to expose each of a portion of the first alignment electrode ALE1 and a portion of the second alignment electrode ALE2.

The second insulating layer INS2 may be provided and/or formed on the light emitting element LD. The second insulating layer INS2 may be provided and/or formed on the light emitting element LD to cover a portion of an upper surface of the light emitting element LD such that the opposite ends of the light emitting element LD are exposed to the outside. The second insulating layer INS2 may more reliably fix the light emitting element LD.

The first pixel electrode PE1 and the second pixel electrode PE2 may be disposed on the second insulating layer INS2 on the light emitting element LD and may be spaced from each other.

The first pixel electrode PE1 may be formed on the first alignment electrode ALE1 and one end of the light emitting element LD and thus electrically connected with the one end of the light emitting element LD. The first pixel electrode PE1 may directly contact the first alignment electrode ALE1 that is exposed by removing a portion of the first insulating layer INS1, and thus may be electrically and/or physically connected with the first alignment electrode ALE1. In one or more embodiments, the first pixel electrode PE1 may be an anode.

The second pixel electrode PE2 may be formed on the second alignment electrode ALE2 and a remaining end of the light emitting element LD and thus electrically connected with the remaining end of the light emitting element LD. The second pixel electrode PE2 may directly contact the second alignment electrode ALE2 that is exposed by removing another portion of the first insulating layer INS1, and thus may be electrically and/or physically connected with the second alignment electrode ALE2. In one or more embodiments, the second pixel electrode PE2 may be a cathode.

The first pixel electrode PE1 and the second pixel electrode PE2 may be formed of various transparent conductive materials to allow light emitted from the light emitting element LD to travel in the image display direction of the display device DD without loss.

In one or more embodiments, the first pixel electrode PE1 and the second pixel electrode PE2 may be provided on different layers. In this case, the third insulating layer INS3 may be provided and/or formed between the first pixel electrode PE1 and the second pixel electrode PE2. The third insulating layer INS3 may be provided on the first pixel electrode PE1 and cover the first pixel electrode PE1 (or prevent the first pixel electrode PE1 from being exposed to the outside), thus preventing corrosion or the like of the first pixel electrode PE1 from being caused. The third insulating layer INS3 may be formed of an inorganic insulating layer including inorganic material, or an organic insulating layer including organic material.

The fourth insulating layer INS4 may be provided and/or formed on the first pixel electrode PE1 and the second pixel electrode PE2. The fourth insulating layer INS4 may be an inorganic layer (an inorganic insulating layer) including inorganic material or an organic layer (an organic insulating layer) including organic material. For example, the fourth insulating layer INS4 may have a structure formed by alternately stacking at least one inorganic layer and at least one organic layer. The fourth insulating layer INS4 may cover the entirety of the display element layer DPL and prevent external water or moisture from being drawn into the display element layer DPL including the light emitting elements LD.

In one or more embodiments, as illustrated in FIG. 12, a dummy bank D_BNK (or a second bank) and a color conversion layer CCL may be provided and/or formed on the fourth insulating layer INS4.

The dummy bank D_BNK may be disposed on the fourth insulating layer INS4 on the bank BNK and embody a dam DAM (or a dam structure) along with the bank BNK. The dam DAM may be a structure that ultimately defines, in the pixel PXL, the emission area EMA from which light is to be emitted. In one or more embodiments, during a process of supplying the color conversion layer CCL to the emission area PXA, the dam DAM may be a structure that ultimately defines the emission area EMA to which the color conversion layer CCL is to be supplied. For example, because the emission area EMA of the pixel PXL is ultimately defined by the dam DAM, a desired amount and/or type of color conversion layer CCL may be supplied (or input) to the emission area EMA.

The dummy bank D_BNK may include light block material. For example, the dummy bank D_BNK may be a black matrix. In one or more embodiments, the dummy bank D_BNK may include at least one light block material and/or reflective material, and allow light emitted from the light emitting elements LD to more reliably travel in the image display direction (or the third direction DR3) of the display device, thus enhancing the light output efficiency of the light emitting elements LD.

The color conversion layer CCL may be disposed on the fourth insulating layer INS4 over the first and second pixel electrodes PE1 and PE2. For example, the color conversion layer CCL may be disposed in the emission area EMA of the pixel area PXA.

The color conversion layer CCL may include color conversion particles QD corresponding to a specific color. For example, the color conversion layer CCL may include color conversion particles QD that convert a first color of light emitted from the light emitting elements LD to a second color (or a specific color) of light. In case that the pixel PXL is a red pixel (or a red sub-pixel), the color conversion layer CCL of the corresponding pixel PXL may include color conversion particles QD formed of red quantum dots that convert a first color of light emitted from the light emitting elements LD to a second color of light, e.g., red light. In case that the pixel PXL is a green pixel (or a green sub-pixel), the color conversion layer CCL of the corresponding pixel PXL may include color conversion particles QD formed of green quantum dots that convert a first color of light emitted from the light emitting elements LD to a second color of light, e.g., green light. In case that the pixel PXL is a blue pixel (or a blue sub-pixel), the color conversion layer CCL of the corresponding pixel PXL may include color conversion particles QD formed of blue quantum dots that convert a first color of light emitted from the light emitting elements LD to a second color of light, e.g., blue light. In one or more embodiments, in case that the pixel PXL is a blue pixel (or a blue sub-pixel), there may be provided a light scattering layer having light scattering particles SCT, in place of the color conversion layer CCL having the color conversion particles QD. For example, in case that the light emitting elements LD emit blue-based light, the pixel PXL may include a light scattering layer including light scattering particles SCT. The light scattering layer may be omitted depending on embodiments. In one or more embodiments, in case that the pixel PXL is a blue pixel (or a blue sub-pixel), there may be provided a transparent polymer, in place of the color conversion layer CCL.

A capping layer CPL may be provided and/or formed on the color conversion layer CCL and the dummy bank D_BNK.

The capping layer CPL may be provided on the overall surface (or the entirety) of the pixel area PXA and may be directly disposed on the dummy bank D_BNK and the color conversion layer CCL. The capping layer CPL may be an inorganic layer (or an inorganic insulating layer) including inorganic material. The capping layer CPL may include at least one of silicon nitride ($SiN_x$), silicon oxide ($SiO_x$), silicon oxynitride ($SiO_xN_y$), and metal oxide such as aluminum oxide ($AlO_x$). The capping layer CPL may be disposed on the color conversion layer CCL and cover the color conversion layer CCL, thus protecting the color conversion layer CCL.

In one or more embodiments, the capping layer CPL may mitigate a step difference formed by components disposed thereunder and have a planar surface. For example, the capping layer CPL may include an organic layer including organic material. The capping layer CPL may be a common layer provided in common in the display area DA including the pixel area PXA, but the present disclosure is not limited thereto.

The color filter CF and the light block pattern LBP may be provided and/or formed on the capping layer CPL.

The color filter CF may allow a specific color of light to selectively pass therethrough. The color filter CF along with the color conversion layer CCL may form the light conversion pattern LCP, and include color filter material that allows a specific color of light converted by the color conversion layer CCL to selectively pass therethrough. The color filter CF may include a red color filter, a green color filter, and a blue color filter. The color filter CF may be provided on one surface of the capping layer CPL and correspond to the color conversion layer CCL.

The light conversion pattern LCP including the color conversion layer CCL and the color filter CF may correspond to the emission area EMA of the pixel PXL.

The light block pattern LBP may be disposed on one surface of the capping layer CPL at a position adjacent to the color filter CF. For example, the light block pattern LBP may be disposed on one surface of the capping layer CPL and correspond to the non-emission area NEMA of the pixel area PXA. The light block pattern LBP may correspond to the dam DAM. The light block pattern LBP may include light block material for preventing a light leakage defect in which light (or rays) leaks between the pixel PXL and pixels PXL adjacent thereto. For example, the light block pattern LBP may include a black matrix. The light block pattern LBP may prevent different colors of light emitted from respective adjacent pixels PXL from being mixed.

The light block pattern LBP may have a multilayer (or multi-film) structure in which two or more color filters allowing different colors of light to selectively pass therethrough overlap each other. For example, the light block pattern LBP may be provided in the form of a structure including a red color filter, a green color filter disposed on the red color filter and overlapping the red color filter, and a blue color filter disposed on the green color filter and overlapping the green color filter. In other words, the light block pattern LBP may be provided in the form of a structure formed by successively stacking the red color filter, the green color filter, and the blue color filter. In this case, in the non-emission area NEMA of the pixel area PXA, the red color filter, the green color filter, and the blue color filter may be used as the light block pattern LBP for blocking transmission of light.

The cover layer CVL may be provided and/or formed on the light block pattern LBP and the color filter CF.

In the display device DD in accordance with the foregoing embodiment, the light conversion pattern LCP may be disposed on the light emitting element LD so that light having excellent color reproducibility can be emitted through the light conversion pattern LCP, whereby the light output efficiency of the display device can be enhanced.

Figure 13:
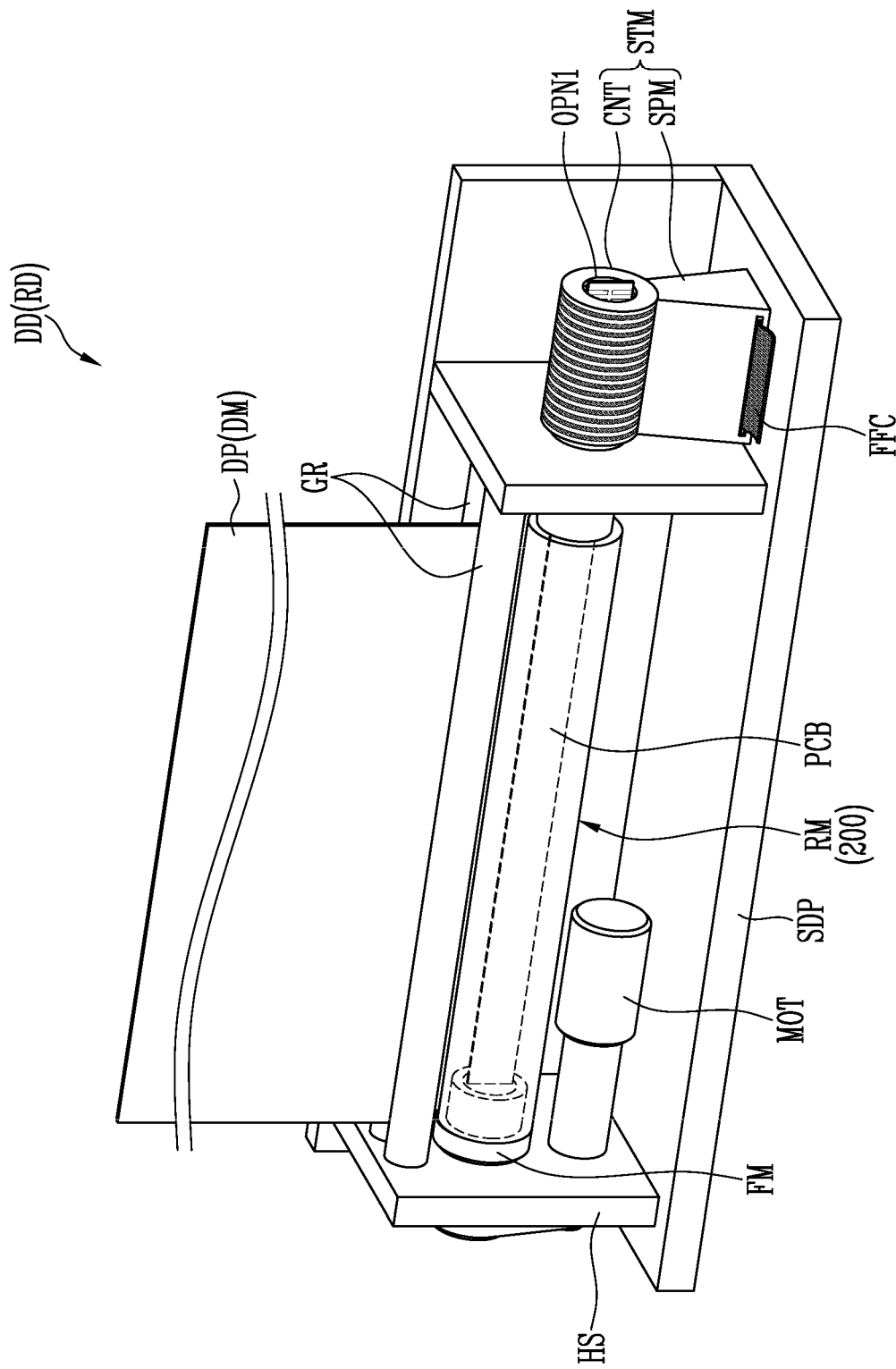
FIG. 13 is a perspective view schematically illustrating a portion of the display device in accordance with one or more embodiments.
Figure 14:
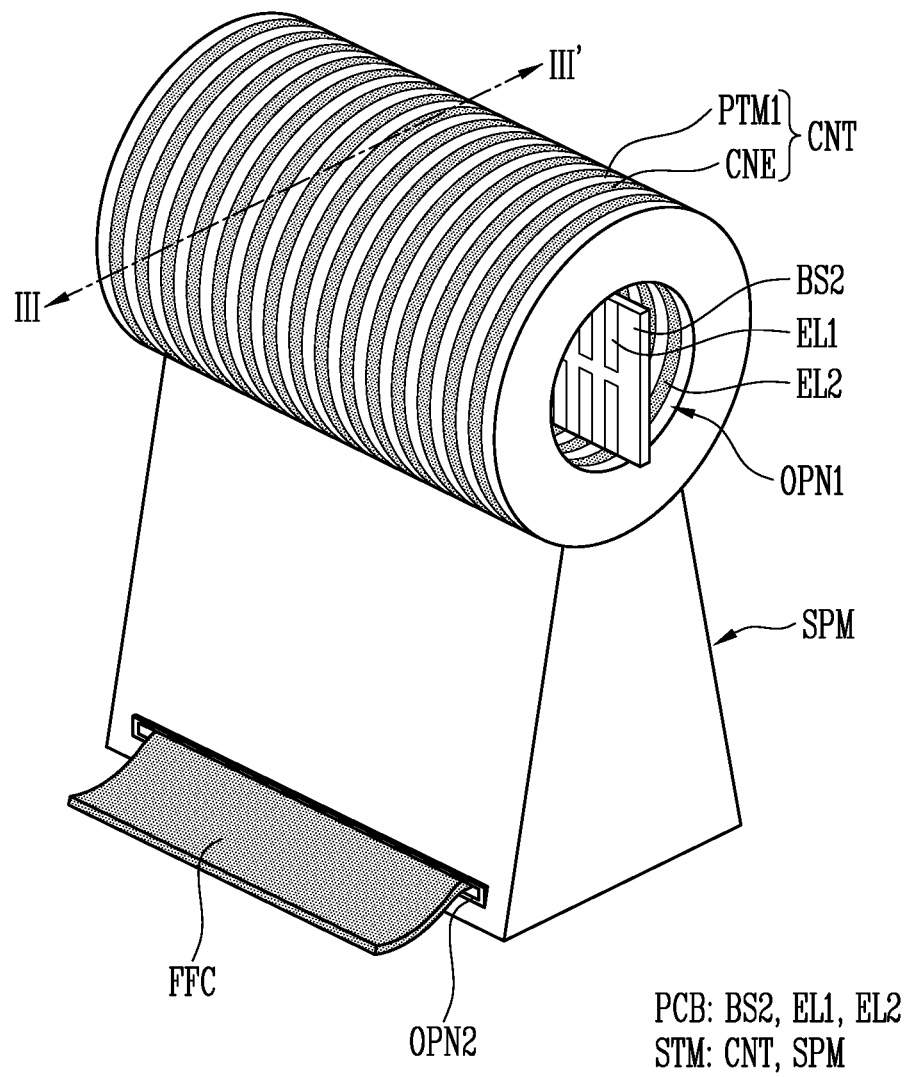
FIG. 14 is a schematic perspective view illustrating an enlargement of a structure of FIG. 13.
Figure 15:
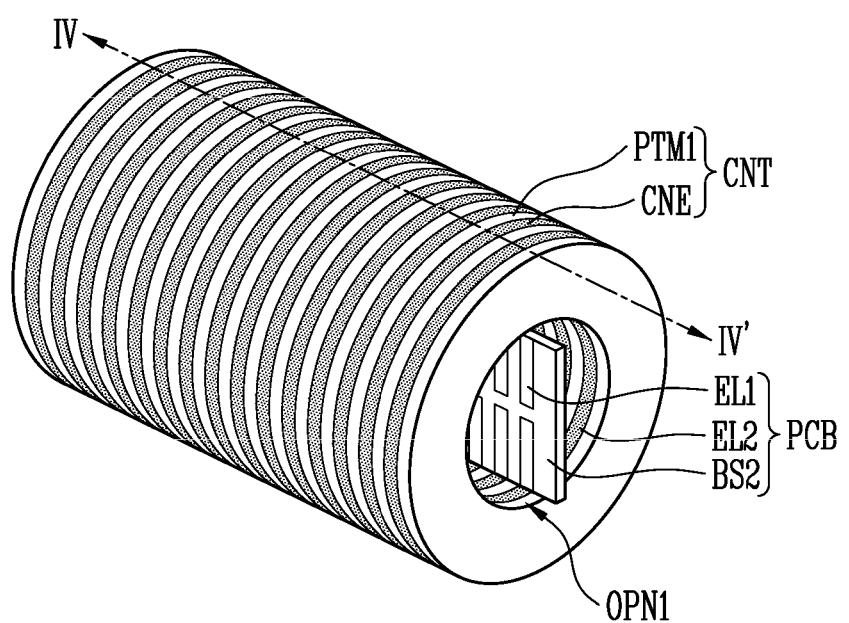
FIG. 15 is a perspective view schematically illustrating a connector of FIG. 14.
Figure 16:
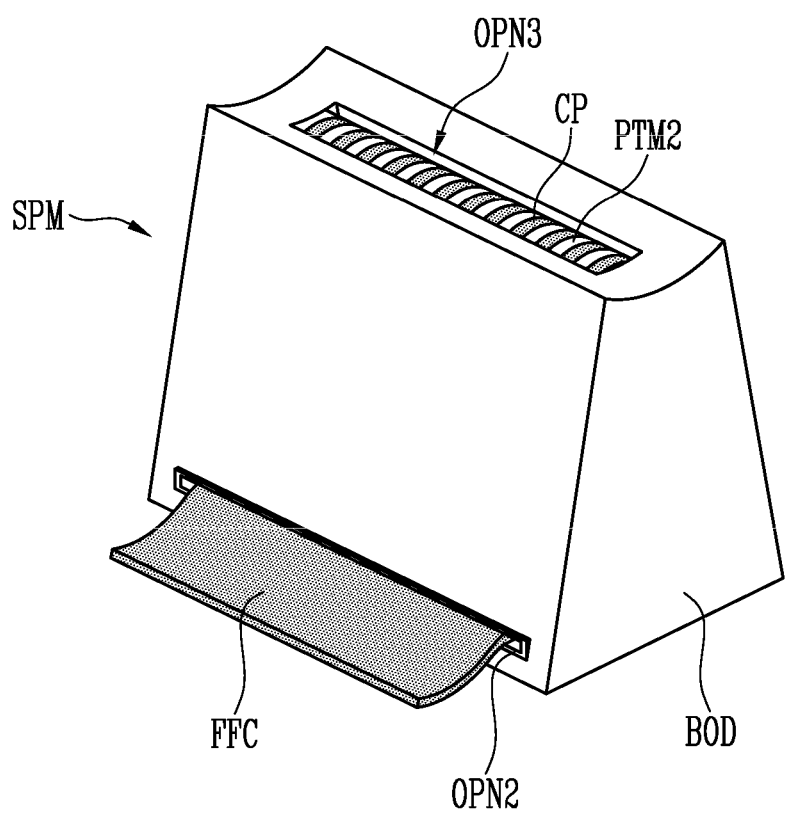
FIG. 16 is a perspective view schematically illustrating a support component of FIG. 14.
Figure 17:
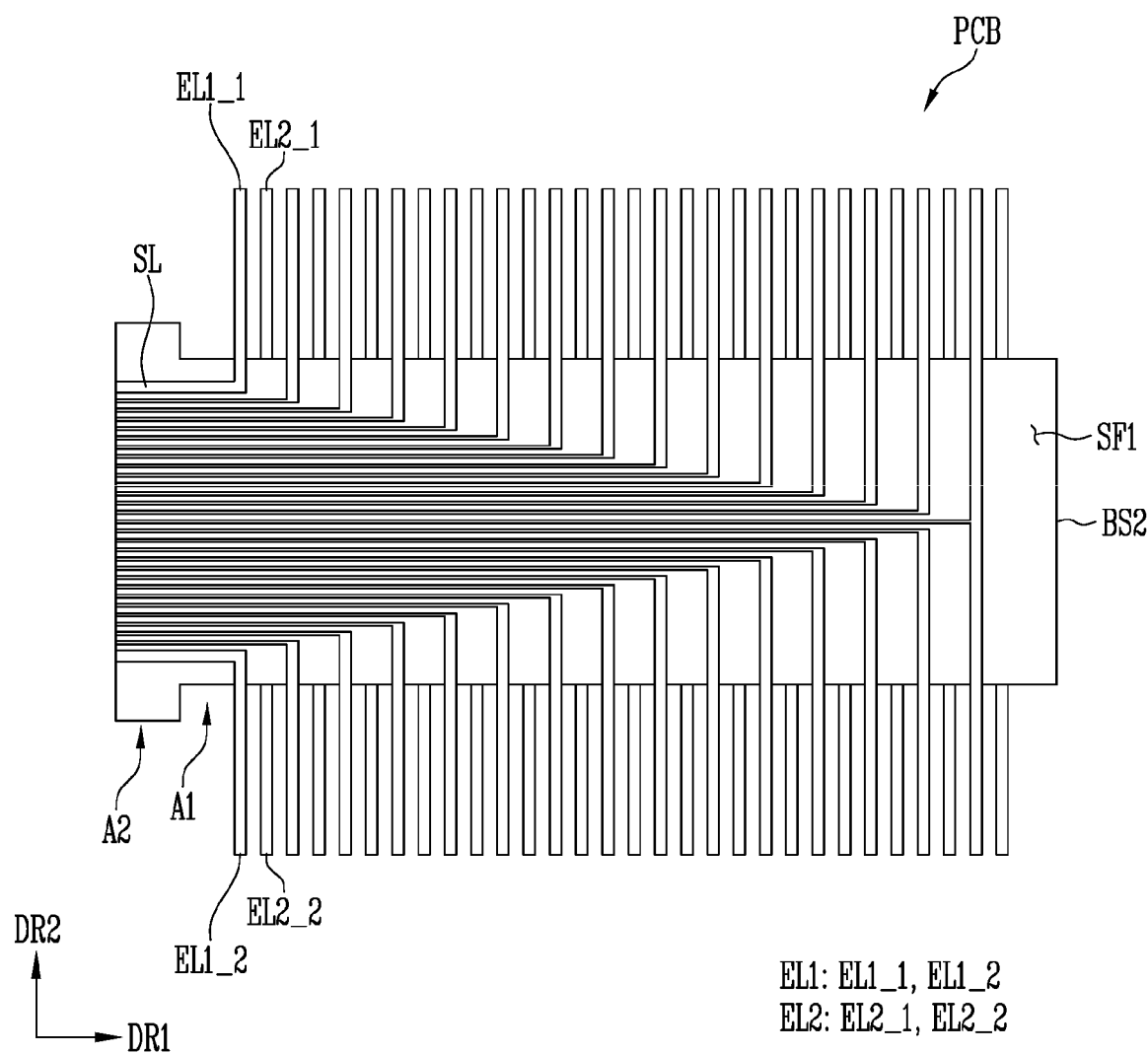
FIG. 17 is a schematic plan view illustrating one side of a circuit board of FIG. 13.
Figure 18:
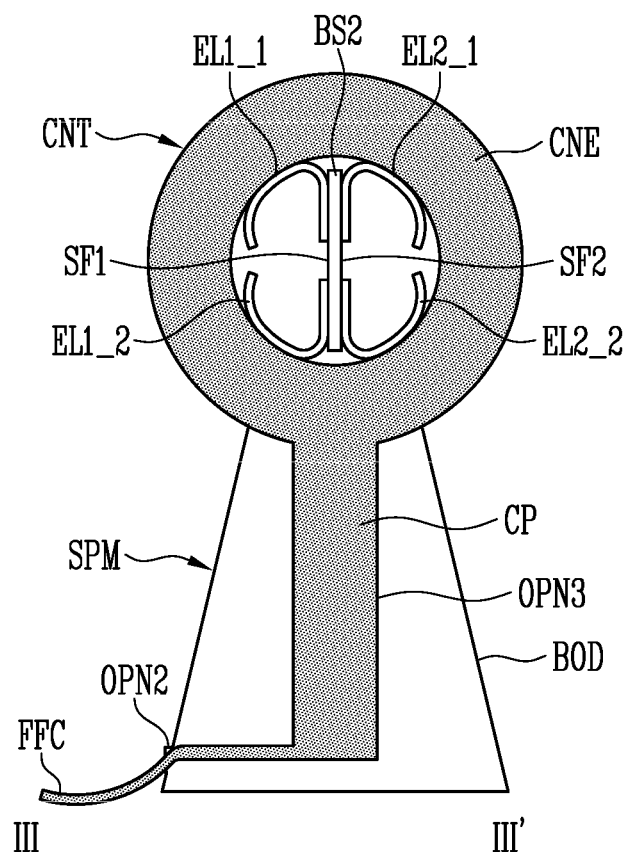
FIG. 18 is a schematic sectional view taken along the line III-III' of FIG. 14.
Figure 19:
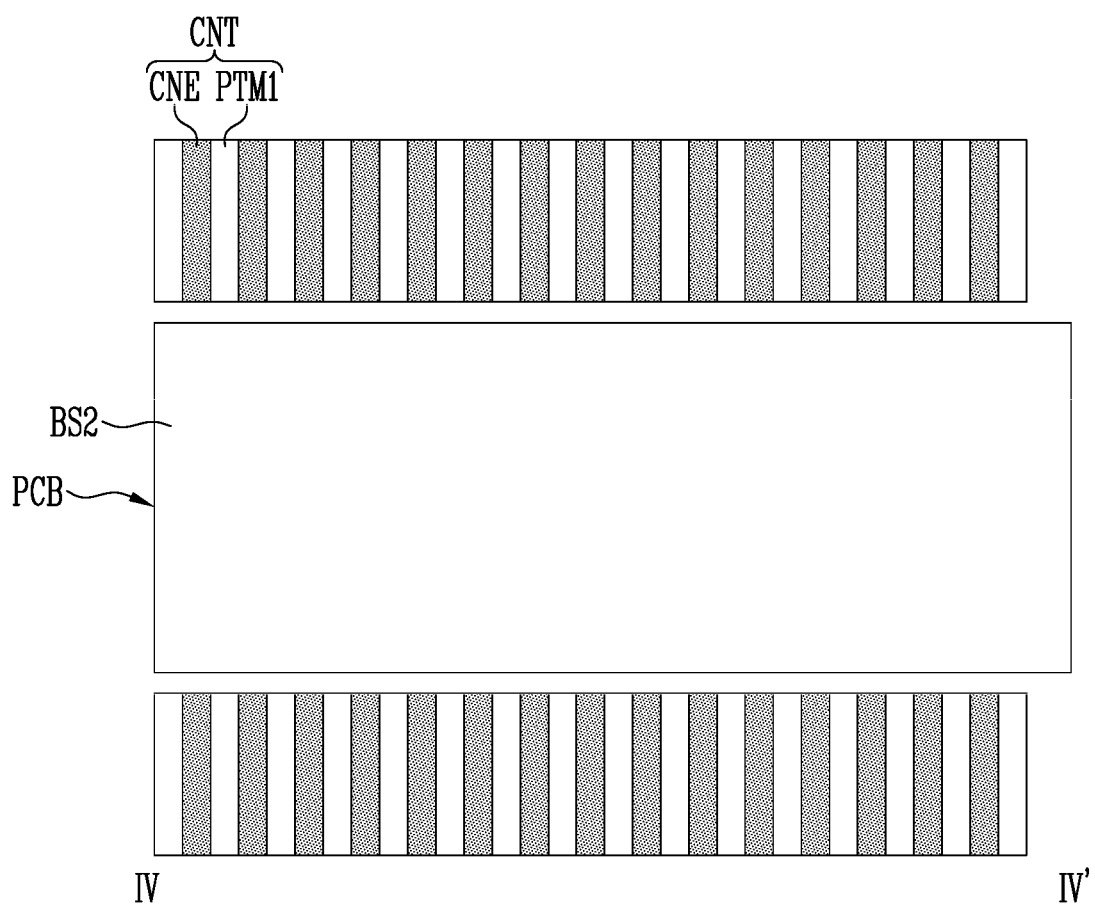
FIG. 19 is a schematic sectional view taken along the line IV-IV' of FIG. 15.
Figure 20:
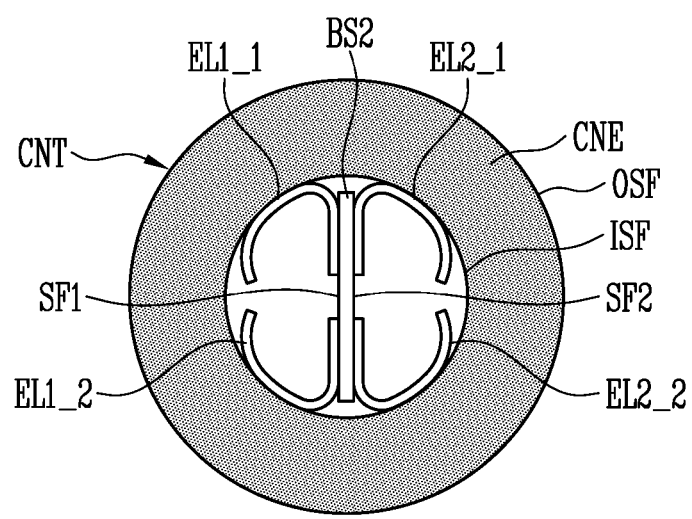
FIG. 20 is a schematic sectional view illustrating a connection relationship between the circuit board and the connector.
Figure 21:
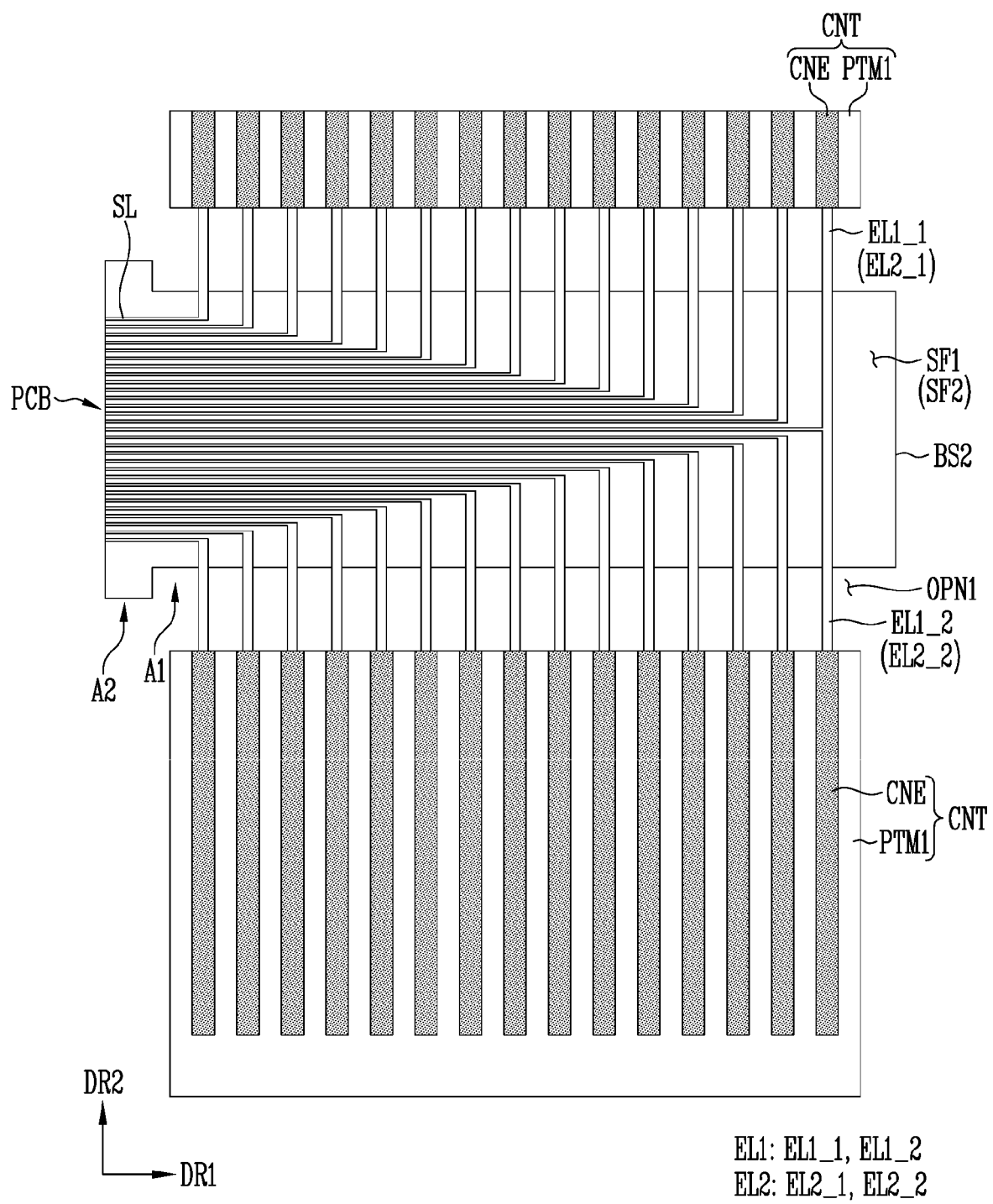
FIG. 21 is a schematic plan view illustrating a connection relationship between the circuit board and the connector.

FIG. 13 is a perspective view schematically illustrating a portion of the display device DD in accordance with an embodiment. FIG. 14 is a schematic perspective view illustrating an enlargement of a structure STM of FIG. 13. FIG. 15 is a perspective view schematically illustrating a connector CNT of FIG. 14. FIG. 16 is a perspective view schematically illustrating a support component SPM of FIG. 14. FIG. 17 is a schematic plan view illustrating one side of a circuit board PCB of FIG. 13. FIG. 18 is a schematic sectional view taken along the line III-III' of FIG. 14. FIG. 19 is a schematic sectional view taken along the line IV-IV' of FIG. 15. FIG. 20 is a schematic sectional view illustrating a connection relationship between the circuit board PCB and the connector CNT. FIG. 21 is a schematic plan view illustrating a connection relationship between the circuit board PCB and the connector CNT. For example, FIG. 21 schematically illustrates a cut and developed view of the connector CNT having a cylindrical shape.

The following description with reference to FIGS. 13 to 21 will be focused on differences from that of the foregoing embodiments, to avoid redundant explanation.

In FIGS. 17 and 21, a horizontal direction in a plan view is indicated by a first direction DR1, and a vertical direction in a plan view is indicated by a second direction DR2.

Referring to FIGS. 1 to 21, the display device DD in accordance with one or more embodiments may include a display panel DP (or a display module DM), a rotator RM, a housing HS, and a mounting component SDP. The display device DD may be a rollable display device RD.

The display panel DP (or the display module DM) may have flexibility. For example, the display panel DP may have rolling characteristics. Hence, in case that the display device DD is in a closed mode, the display panel DP is wound and received in the housing HS. In case that the display device DD is in an open mode, the display panel DP may be drawn out (or unwound) in a direction opposite to the winding direction and thus deployed from the housing HS in one direction.

The display panel DP may be converted from a completely wound state to a completely deployed state, or from the completely deployed state to the completely wound state. The completely wound state may refer to a state in which the display panel DP is received in the housing HS and the display device DD does not display an image. In one or more embodiments, the display panel DP may be converted from the completely wound state to a partially deployed state. The partially deployed state of the display panel DP may refer to a state in which a portion of the display panel DP is located outside the housing HS.

The rotator RM may be received in the housing HS and wind and/or deploy the display panel DP. For example, the rotator RM may be received in the housing HS, fasten one side of the display panel DP, and rotate in a clockwise direction or a counterclockwise direction to wind and/or deploy the display panel DP. The rotator RM may be coupled at one end thereof to a fastener FM and thus fastened in the housing HS.

The rotator RM may be driven and rotated by a roller driver MOT coupled to the fastener FM. In one or more embodiments, the roller driver MOT may include a motor. The motor may include, for example, a stepping motor, a servomotor, or the like. The rotor driver MOT may be disposed in the housing HS. The roller driver MOT may be connected to the power supply 20 (e.g., see FIG. 2) mounted in the mounting component SDP and thus supplied with power from the power supply 20. The roller driver MOT may generate rotational force and provide driving force to the rotator RM. The rotator RM may be supplied with the rotational force from the roller driver MOT and perform a rotational motion to wind and/or deploy the display panel DP.

A slot HSO may be formed in the housing HS to allow the display panel DP to move into or out of the housing HS. The display panel DP may move upward or downward through the slot HSO of the housing HS.

A plurality of guide rollers GR are disposed in the housing HS to guide the display panel DP in the movement direction when the display panel DP is wound and/or deployed (or unwound). Some of the guide rollers GR may be tension rollers configured to adjust a degree to which the display panel DP is tensed when the display panel DP is deployed.

The circuit board PCB may be disposed in the rotator RM. For example, the circuit board PCB may be disposed inside the rotating cylinder 200 of the rotator RM and rotated by a rotational motion of the rotator RM. In one or more embodiments, one area (or one side) of the circuit board PCB may be located outside the rotator RM so as to receive a signal from the structure STM. In the following embodiment, for the sake of description, the one area of the circuit board PCB that is located outside the rotator RM is designated as a first area A1, and the other area of the circuit board PCB that is located inside the rotator RM and enclosed by the rotator RM is designated as a second area A2 (e.g., see FIG. 17).

The circuit board PCB may include a second base layer BS2 (or a second base substrate), signal lines SL, a first electrode EL1, and a second electrode EL2.

The second base layer BS2 may be formed of a flexible film. The second base layer BS2 may include a first surface SF1 and a second surface SF2 which face each other.

The signal lines SL may be provided and/or formed on the first surface SF1 of the second base layer BS2 and electrically connected with the pixels PXL provided in the display panel DP. The signal lines SL may extend in the first direction DR1 in a plan view. A plurality of signal lines SL may be provided and/or formed on the second surface SF2 of the second base layer BS2. Each of the signal lines SL may be physically and/or electrically connected to a corresponding electrode (e.g., the first electrode EL1 or the second electrode EL2).

The first electrode EL1 may be disposed on the first surface SF1 of the second base layer BS2, and a plurality of first electrodes EL1 may be provided. The first electrodes EL1 may extend in the second direction DR2 intersecting the first direction DR1, in a plan view. Each of the first electrodes EL1 may be connected with a corresponding signal line SL among the signal lines SL. For example, each of the first electrodes EL1 may be integrally provided with the corresponding signal line SL and thus physically and electrically connected with the corresponding signal line SL. In case that each of the first electrodes EL1 is integrally provided with the corresponding signal line SL, the first electrode EL1 may be regarded as a part of the corresponding signal line SL.

In one or more embodiments, each of the first electrodes EL1 may include a 1-1-th electrode EL1_1 and a 1-2-th electrode EL1_2 that respectively extend from ends of the corresponding signal line SL in one direction, e.g., the second direction DR2, and protrude out of the second base layer BS2. Each of the first electrodes EL1 may have flexibility, and a part thereof may be bent to make contact with the structure STM. As illustrated in FIGS. 18 and 20, the 1-1-th electrode EL1_1 and the 1-2-th electrode EL1_2 of each of the first electrodes EL1 may be bent from the first surface SF1 of the second base layer BS2 in an upward direction thereof and face each other, but the present disclosure is not limited thereto.

The second electrode EL2 may be disposed on the second surface SF2 of the second base layer BS2, and a plurality of second electrodes EL2 may be provided. The second electrode EL2 may be electrically separated from the first electrode EL1 on the second base layer BS2. The second electrodes EL2 may extend in the second direction DR2, in a plan view. The second electrodes EL2 may be connected with a corresponding signal line SL of the signal lines that are disposed on the second surface SF2 of the second base layer BS2.

In one or more embodiments, each of the second electrodes EL2 may include a 2-1-th electrode EL2_1 and a 2-2-th electrode EL2_2 that respectively extend from ends of the corresponding signal line SL in the second direction DR2, and protrude out of the second base layer BS2. The 2-1-th electrode EL2_1 may be spaced from the 1-1-th electrode EL1_1 in the first direction DR1. The 2-2-th electrode EL2_2 may be spaced from the 1-2-th electrode EL1_2 in the first direction DR1. Each of the second electrodes EL2 may have flexibility, and a part thereof may be bent to make contact with the structure STM. For example, as illustrated in FIGS. 18 and 20, the 2-1-th electrode EL2_1 and the 2-2-th electrode EL2_2 of each of the second electrodes EL2 may be bent from the second surface SF2 of the second base layer BS2 in an upward direction thereof and face each other, but the present disclosure is not limited thereto.

In one or more embodiments, the foregoing circuit board PCB may be electrically connected to the structure STM disposed in the housing HS and may be supplied with an electrical signal from the structure STM.

The structure STM may include a connector CNT and a support component SPM.

The connector CNT may include a plurality of connection electrodes CNE, and a first protective component PTM1 disposed between the connection electrodes CNE. The respective connection electrodes CNE and the first protective component PTM1 may be alternately disposed along a certain direction, thus forming the connector CNT.

The connector CNT may include a first opening OPN1. The first area A1 of the circuit board PCB may be inserted into the first opening OPN1 of the connector CNT. In one or more embodiments, the connector CNT may be designed to have a shape including the first opening OPN1 into which the first area A1 of the circuit board PCB is inserted.

The connector CNT may have a cylindrical shape including the first opening OPN1, but the present disclosure is not limited thereto. Each of the connection electrodes CNE and the first protective component PTM1 may have shapes corresponding to the connector CNT. For example, each connection electrode CNE and the first protective component PTM1 may have closed loop shapes. In one or more embodiments, the first protective component PTM1 having a closed loop shape and the connection electrode CNE having a closed loop shape may be alternately formed in a direction in which a cutting line IV-IV' (or a sectional line) illustrated in FIG. 15 extends, thus forming the connector CNT including the first opening OPN1.

Each connection electrode CNE may be physically and/or electrically connected to a corresponding first electrode EL1 and a corresponding second electrode EL2 from among the first and second electrodes EL1 and EL2. For example, each connection electrode CNE may contact the 1-1-th and 1-2-th electrodes EL1_1 and EL1_2 that are bent from the first surface SF1 of the second base layer BS2 in an upward direction thereof, and may be physically and electrically connected with the 1-1-th and 1-2-th electrodes EL1_1 and EL1_2. Furthermore, each connection electrode CNE may contact the 2-1-th and 2-2-th electrodes EL2_1 and EL2_2 that are bent from the second surface SF2 of the second base layer BS2 in an upward direction thereof, and may be physically and electrically connected with the 2-1-th and 2-2-th electrodes EL2_1 and EL2_2.

The first and second electrodes EL1 and EL2 that protrude out of the second base layer BS2 may be bent toward the connection electrodes CNE of the connector CNT so that a contact surface area between the first and second electrodes EL1 and EL2 and the connection electrodes CNE can be increased. Hence, even when the circuit board PCB is rotated by the rotator RM and thus the first and second electrodes EL1 and EL2 rotate, the first and second electrodes EL1 and EL2 may be reliably physically and electrically connected to the connection electrodes CNE each having a closed loop shape, regardless of the rotation of the circuit board PCB.

Each of the connection electrodes CNE may be electrically connected to a conductive cable FFC and thus transmit an electrical signal, power, and the like from the mounting component SDP to the corresponding first electrode EL1 and the corresponding second electrode EL2.

The first protective component PTM1 may be disposed between the connection electrodes CNE, thus preventing a short-circuit defect between the connection electrodes CNE from occurring. The first protective component PTM1 may include material such as plastic or ceramic, having insulating properties.

The support component SPM may include a body BOD, conductive patterns CP, and a second protective component PTM2.

The body BOD may support the connector CNT. The body BOD may include a second opening OPN2 and a third opening OPN3. One side of the conductive cable FFC may be inserted into the second opening OPN2 of the body BOD so that the conductive cable FFC and the conductive patterns CP may be physically and electrically connected to each other. The conductive patterns CP and the second protective component PTM2 may be disposed in the third opening OPN3 of the body BOD. The second opening OPN2 and the third opening OPN3 may be connected to each other and form a through hole TH that passes through one area of the body BOD.

The body BOD may be integrally provided with the second protective component PTM2. In this case, the second protective component PTM2 may be regarded as one area of the body BOD. The body BOD and the second protective component PTM2 may include the same material as that of the first protective component PTM1.

Each conductive pattern CP may be disposed in the through hole TH and electrically connected with the conductive cable FFC and a corresponding connection electrode CNE among the connection electrodes CNE. For example, one end of each conductive pattern CP in the through hole TH may contact the corresponding connection electrode CNE and may be physically and electrically connected to the corresponding connection electrode CNE. A remaining end of the corresponding conductive pattern CP in the through hole TH may contact the conductive cable FFC and may be physically and electrically connected to the conductive cable FFC.

In one or more embodiments, each conductive pattern CP may pass through the third opening OPN3 and may be connected to the corresponding connection electrode CNE of the connector CNT. For example, each conductive pattern CP may be integrally provided with the corresponding connection electrode CNE. In this case, each conductive pattern CP may be regarded as a part of the connection electrode CNE, or the corresponding connection electrode CNE may be regarded as a part of the conductive pattern CP.

The second protective component PTM2 may be disposed between the conductive patterns CP, thus preventing a short-circuit defect between the conductive patterns CP from occurring. The second protective component PTM2 may be integrally provided with the body BOD, and may be a part of the body BOD.

In one or more embodiments, the second protective component PTM2 may be connected to the first protective component PTM1 of the connector CNT through the third opening OPN3. For example, the second protective component PTM2 may be integrally provided with the first protective component PTM1.

The conductive cable FFC may be inserted into the second opening OPN2 of the support component SPM and fastened in the housing HS, and electrically connected to the corresponding conductive pattern CP. Furthermore, the conductive cable FFC may be electrically connected to the mounting component SDP. The conductive cable FFC may electrically connect the mounting component SDP and the connector CNT and transmit an electrical signal to the display panel DP (or the pixel PXL) through the circuit board PCB. The conductive cable FFC may be a flexible flat cable, but the present disclosure is not limited thereto.

As described above, the first and second electrodes EL1 and EL2 of the circuit board PCB may protrude out of the second base layer BS2 and may be bent from one surface (e.g., the first surface SF1 or the second surface SF2) of the second base layer BS2 in an upward direction thereof (e.g., in a direction for contacting the connector CNT). If the first area A1 of the circuit board PCB is inserted into the first opening OPN1 of the connector CNT, the first and second electrodes EL1 and EL2 may directly contact the connection electrodes CNE of the connector CNT and thus may be physically and electrically connected to the connection electrodes CNE.

The connection electrodes CNE may be integrally provided with the conductive patterns CP of the support component SPM and electrically connected with the conductive cable FFC through the conductive patterns CP. One end of the conductive cable FFC may be electrically connected to the conductive patterns CP of the support component SPM, and a remaining end thereof may be electrically connected to the mounting component SDP. Hence, signals, power, and the like may be transmitted from the mounting component SDP to the circuit board PCB through the conductive cable FFC and the structure STM (e.g., the support component SPM and the connector CNT) and thus supplied to the pixels PXL of the display panel DP.

In a conventional rollable display device, a conductive cable may wind a circuit board exposed outside a rotator and may be rolled or unwound by rotation of the rotator. Here, in case that the revolutions per minute (RPM) of the rotator is increased or the rotational motion of the rotator is repeatedly performed, the RPM and rotational motion of the conductive cable may be increased, whereby the conductive cable may be unwound. In this case, the conductive cable may be entangled, so that the conductive cable may be damaged. As the conductive cable is wound, it may be difficult for the unwound conductive cable to be received in confined space in the housing.

Given this, in the display device DD in accordance with one or more embodiments, the first and second electrodes EL1 and EL2 disposed in the first area A1 of the circuit board PCB may be formed to protrude out of the second base layer BS2 and bend toward the connector CNT, and the connection electrodes CNE of the connector CNT may be formed to enclose the peripheries of the first and second electrodes EL1 and EL2 and thus contact the first and second electrodes EL1 and EL2, and the conductive cable FFC may be fastened to the support component SPM and electrically connected to the circuit board PCB. Therefore, regardless of movement of the rotator RM (or an operation of winding or deploying the display panel DP), the conductive cable FFC may be prevented from being undesirably unwound. Accordingly, the length of the conductive cable FFC may be reduced so that space can be secured in the housing HS, whereby the ease of design of the display device DD can be enhanced.

Furthermore, in the display device DD in accordance with one or more embodiments, the first protective component PTM1 may be disposed between the connection electrodes CNE of the connector CNT so that a short-circuit defect of the connection electrodes CNE can be reduced or prevented from occurring, whereby the reliability of the connector CNT may be enhanced, thus making electrical connection between the flexible cable FFC and the circuit board PCB more reliable.

Furthermore, in the display device DD in accordance with one or more embodiments, the second protective component PTM2 may be disposed between the conductive patterns CP of the support component SPM so that a short-circuit defect of the conductive patterns CP can be reduced or prevented from occurring, whereby the reliability of the support component SPM may be enhanced.

FIGS. 22A to 22G are schematic sectional views illustrating various embodiments of the connection relationship between the circuit board PCB and the connector CNT.

FIGS. 22A to 22G illustrate various modifications of the embodiment of FIG. 20 with regard to the shape or the like of the circuit board PCB.

The following description related to the embodiments of FIGS. 22A to 22G will be focused on differences from the above-mentioned embodiments so as to avoid redundant description.

Figure 22A:
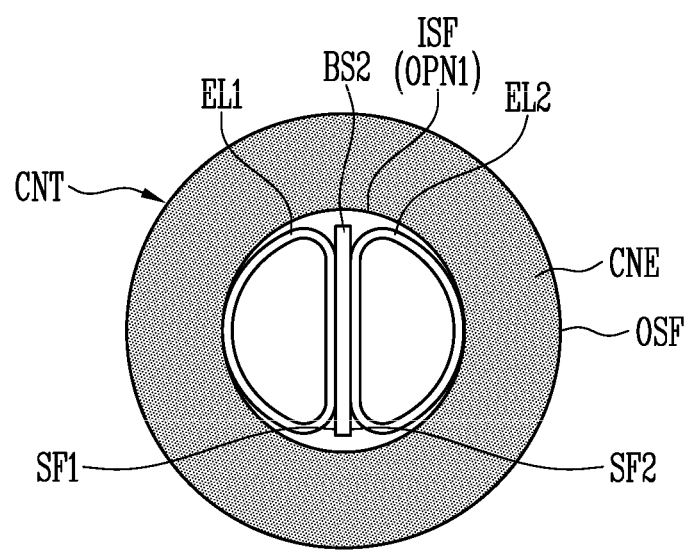
FIGS. 22A to 22G are schematic sectional views illustrating various embodiments of the connection relationship between the circuit board and the connector.

Referring to FIG. 22A, the circuit board PCB that is inserted into the first opening OPN1 of the connector CNT may include a second base layer BS2, at least one first electrode EL1, and at least one second electrode EL2.

The first electrode EL1 may have a closed-loop shape, protruding from the first surface SF1 of the second base layer BS2 and including an opening having a certain curvature in an upward direction of the first surface SF1, and directly contact an inner side surface ISF of the corresponding connection electrode CNE of the connector CNT.

The second electrode EL2 may have a closed-loop shape, protruding from the second surface SF2 of the second base layer BS2 and including an opening having a certain curvature in an upward direction of the second surface SF2, and directly contact an inner side surface ISF of the corresponding connection electrode CNE of the connector CNT.

Figure 22B:
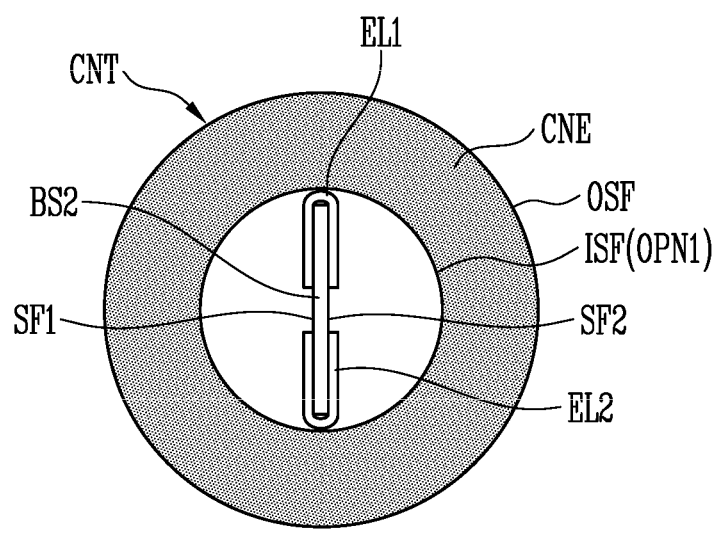

Referring to FIG. 22B, each of the first and second electrodes EL1 and EL2 may be formed over the first surface SF1 and the second surface SF2 of the second base layer BS2, and have a shape enclosing a periphery of one area (e.g., one end) of the second base layer BS2. For example, the first electrode EL1 may protrude from the first surface SF1 (or the second surface SF2) of the second base layer BS2 upward, bend in a shape enclosing a portion (e.g., a first end) of the second base layer BS2, and extend to one area of the second surface SF2 (or the first surface SF1) of the second base layer BS2. Furthermore, the second electrode EL2 may protrude from the second surface SF2 (or the first surface SF1) of the second base layer BS2 downward, bend in a shape enclosing a portion (e.g., a second end) of the second base layer BS2, and may be located on the first surface SF1 (or the second surface SF2) of the second base layer BS2.

Figure 22C:
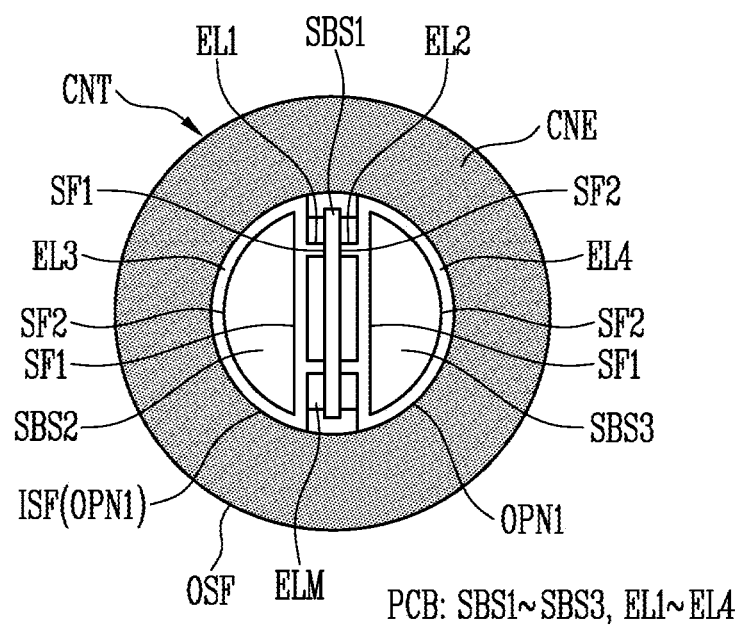

Referring to FIG. 22C, the circuit board PCB may include a first sub-base layer SBS1, a second sub-base layer SBS2, a third sub-base layer SBS3, and first to fourth electrodes EL1, EL2, EL3, and EL4.

The first sub-base layer SBS1 may be disposed in a central portion of the first opening OPN1 of the connector CNT, and include a first surface SF1 and a second surface SF2 that are opposite each other. The first electrode EL1 may be disposed on the first surface SF1 of the first sub-base layer SBS1. The first electrode EL1 may protrude in a direction intersecting a longitudinal direction of the first surface SF1 of the first sub-base layer SBS1. The second electrode EL2 may be disposed on the second surface SF2 of the first sub-base layer SBS1. The second electrode EL2 may protrude in a direction intersecting a longitudinal direction of the second surface SF2 of the first sub-base layer SBS1.

The second sub-base layer SBS2 may be disposed adjacent to the first surface SF1 of the first sub-base layer SBS1. The second sub-base layer SBS2 may include a first surface SF1 spaced from the first sub-base layer SBS1, and a second surface SF2 that protrudes toward the connection electrode CNE of the connector CNT. A third electrode EL3 may be disposed on the second sub-base layer SBS2. The third electrode EL3 may be provided in a shape enclosing both the first surface SF1 and the second surface SF2 of the second sub-base layer SBS2, and contact the first electrode EL1 of the first sub-base layer SBS1 and thus physically and electrically connected to the first electrode EL1. The third electrode EL3 may come into surface contact with the connection electrode CNE of the connector CNT and increase a contact surface area between the circuit board PCB and the connector CNT so that the circuit board PCB and the connector CNT can be more reliably physically and electrically connected to each other.

The third sub-base layer SBS3 may be disposed adjacent to the second surface SF2 of the first sub-base layer SBS1. The third sub-base layer SBS3 may include a first surface SF1 spaced from the first sub-base layer SBS1, and a second surface SF2 that protrudes toward the connection electrode CNE of the connector CNT. A fourth electrode EL4 may be disposed on the third sub-base layer SBS3. The fourth electrode EL4 may be provided in a shape enclosing both the first surface SF1 and the second surface SF2 of the third sub-base layer SBS3, and contact the second electrode EL2 of the first sub-base layer SBS1 and thus physically and electrically connected to the second electrode EL2. The fourth electrode EL4 may come into surface contact with the connection electrode CNE of the connector CNT and increase a contact surface area between the circuit board PCB and the connector CNT so that the circuit board PCB and the connector CNT can be more reliably physically and electrically connected to each other.

An elastic component ELM may be disposed between the first sub-base layer SBS1 and the second sub-base layer SBS2 and between the first sub-base layer SBS1 and the third sub-base layer SBS3.

The elastic component ELM may include material having elasticity, and apply force to each of the third and fourth electrodes EL3 and EL4 so that each of the third and fourth electrodes EL3 and EL4 can contact the connection electrode CNE of the connector CNT.

Figure 22D:
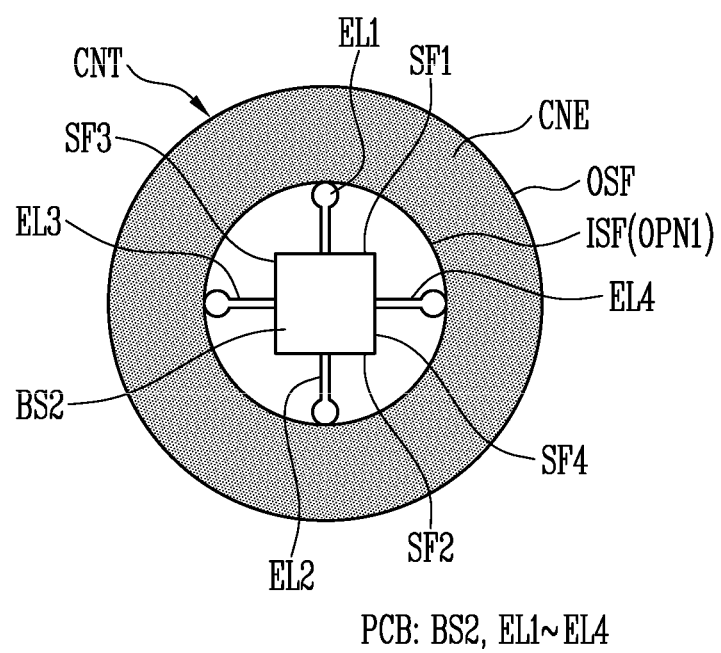

Referring to FIG. 22D, the second base layer BS2 of the circuit boar PCB may include a first surface SF1 and a second surface SF2 that are opposite each other in a vertical direction, and a third surface SF3 and a fourth surface SF4 that are opposite each other in a horizontal direction. The first surface SF1, the second surface SF2, the third surface SF3, and the fourth surface SF4 may have the same length as each other. For example, the second base layer BS2 may have a square shape in a sectional view.

A first electrode EL1 may be formed on the first surface SF1 of the second base layer BS2, a second electrode EL2 may be formed on the second surface SF2 of the second base layer BS2, a third electrode EL3 may be formed on the third surface SF3 of the second base layer BS2, and a fourth electrode EL4 may be formed on the fourth surface SF4 of the second base layer BS2. The first electrode EL1 may extend from the first surface SF1 of the second base layer BS2 in an upward direction thereof and contact the connection electrode CNE of the connector CNT. The second electrode EL2 may extend from the second surface SF2 of the second base layer BS2 in an upward direction thereof and contact the connection electrode CNE of the connector CNT. The third electrode EL3 may extend from the third surface SF3 of the second base layer BS2 in an upward direction thereof and contact the connection electrode CNE of the connector CNT. The fourth electrode EL4 may extend from the fourth surface SF4 of the second base layer BS2 in an upward direction thereof and contact the connection electrode CNE of the connector CNT.

Each of the first to fourth electrodes EL1 to EL4 may be designed such that one area thereof that contacts the connection electrode CNE has a round shape so as to further increase a contact surface area with the connection electrode CNE of the connector CNT.

Figure 22E:
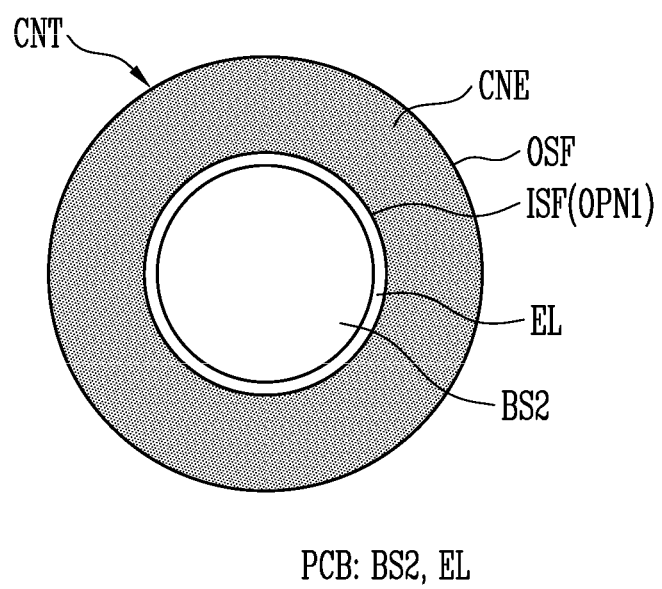

Referring to FIG. 22E, the circuit board PCB may include a second base layer BS2 having a shape corresponding to that of the first opening OPN1 of the connector CNT, and an electrode EL that encloses the second base layer BS2.

The electrode EL may be provided in a shape enclosing a surface (or an outer peripheral or circumferential surface) of the second base layer BS2 and physically and electrically connected to the connection electrode CNE in such a way that an overall surface of the electrode EL directly contacts the connection electrode CNE of the connector CNT. For example, the electrode EL may correspond to an inner side surface ISF of the connection electrode CNE. Hence, the contact surface area between the electrode EL of the circuit board PCB and the connection electrode CNE of the connector CNT may be further increased.

Figure 22F:
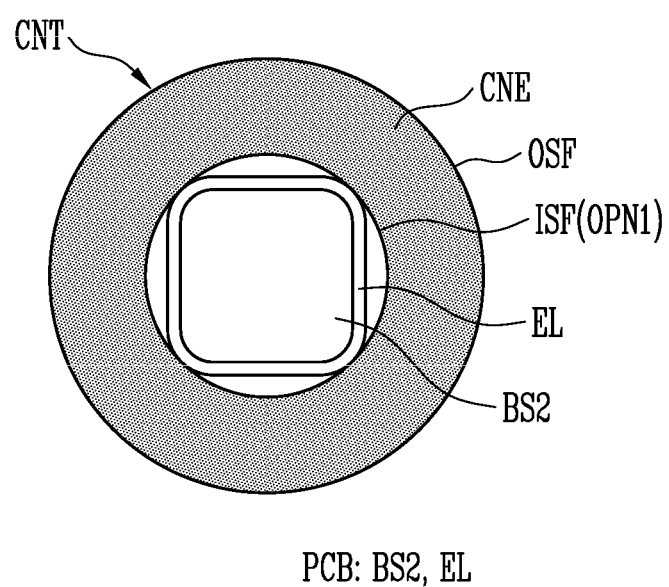

Referring to FIG. 22F, the circuit board PCB may include a second base layer BS2 having a shape different from that of the first opening OPN1 of the connector CNT, and an electrode EL that encloses the second base layer BS2.

The electrode EL may be provided in a shape enclosing a surface of the second base layer BS2, and at least one area thereof may directly contact the connection electrode CNE of the connector CNT.

Figure 22G:
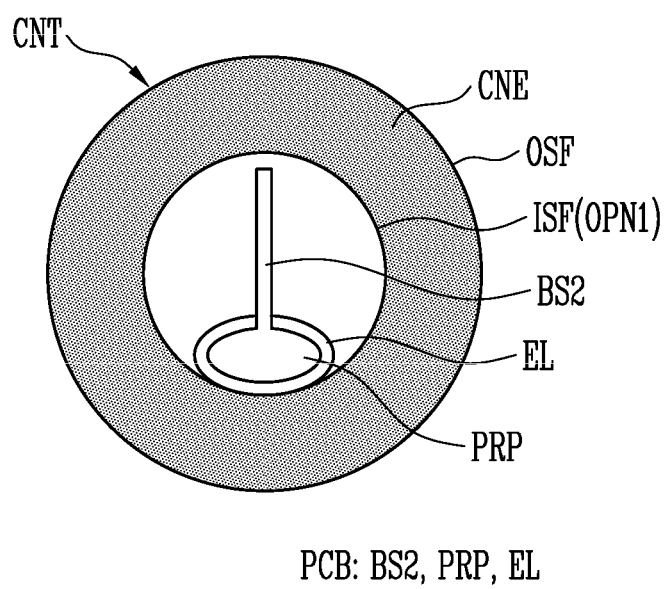

Referring to FIG. 22G, the circuit board PCB may include a second base layer BS2 that is disposed in a central portion of the first opening OPN1 of the connector CNT and include a protrusion PRP, one side surface of which protrudes toward the connection electrode CNE of the connector CNT, and an electrode EL that encloses a periphery of the protrusion PRP.

The electrode EL may be provided in a shape enclosing the periphery of the protrusion PRP, and physically and electrically connected to the connection electrode CNE in such a way that at least one area of the electrode EL directly contacts the connection electrode CNE of the connector CNT.

FIGS. 23A to 23D are schematic sectional views illustrating various embodiments of the connection relationship between the circuit board PCB and the connector CNT.

FIGS. 23A to 23D illustrate modifications of the embodiment of FIG. 20 with regard to the shapes and the like of the connector CNT and the connection electrode CNE.

The description of the embodiments of FIGS. 23A to 23D will be focused on differences from the above-mentioned embodiments so as to avoid redundant description.

Figure 23A:
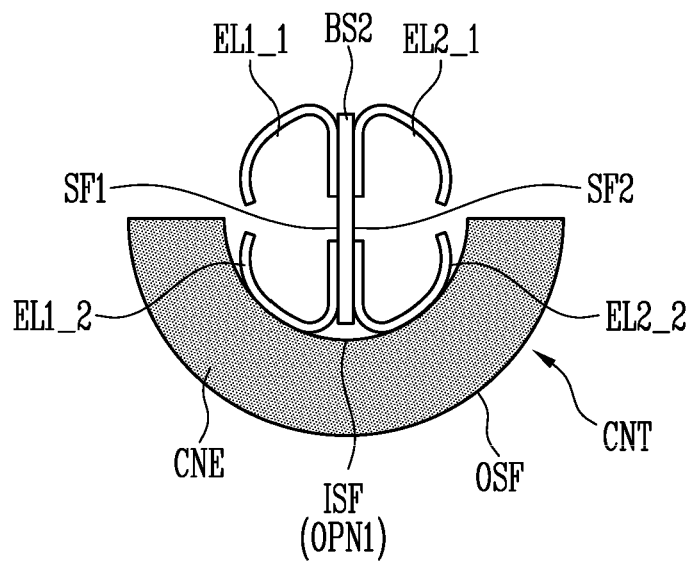
FIGS. 23A to 23D are schematic sectional views illustrating various embodiments of the connection relationship between the circuit board and the connector.
Figure 23B:
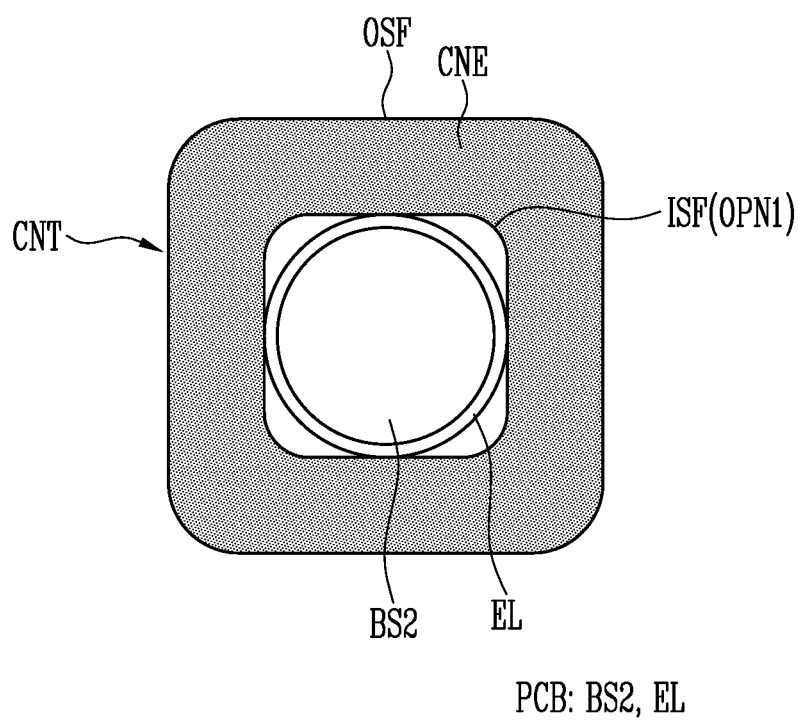
Figure 23C:
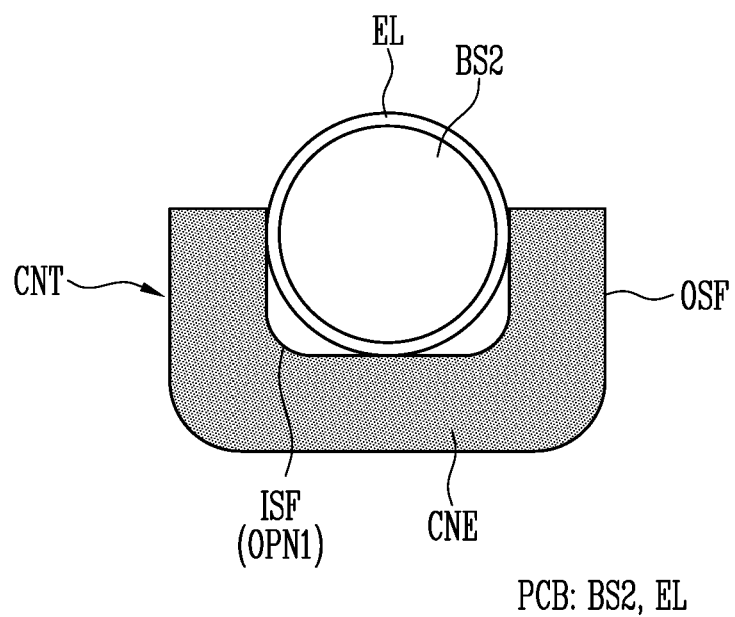
Figure 23D:
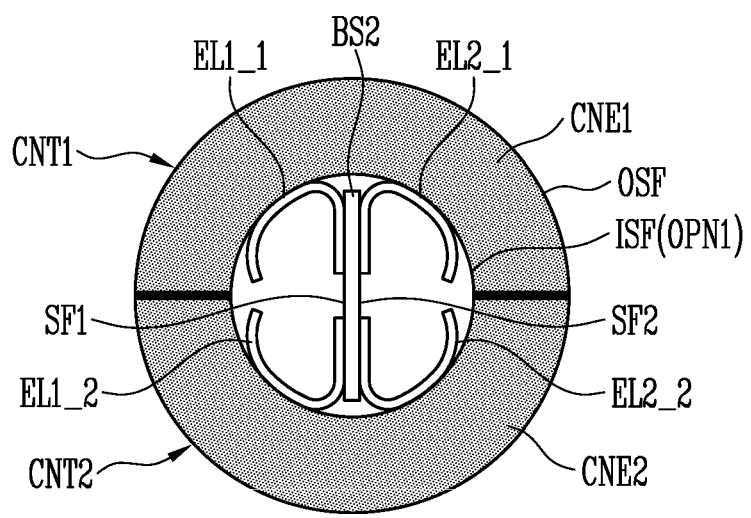

Referring to FIGS. 23A to 23D, the connector CNT may have a shape enclosing the entirety of the circuit board PCB or partially enclosing the circuit board PCB. For example, as illustrated in FIGS. 23A and 23C, the connector CNT may have a shape, partially enclosing a periphery of the circuit board PCB. Alternatively, as illustrated in FIGS. 23B and 23D, the connector CNT may have a shape, enclosing the entirety of the periphery of the circuit board PCB.

In case that the connector CNT has a shape partially enclosing the periphery of the circuit board PCB, as illustrated in FIGS. 23A and 23C, the connection electrode CNE of the connector CNT may have a semi-circular shape, a rectangular shape, or the like, a portion of which is open, rather than completely enclosing the first and second electrodes EL1 and EL2 (or the electrode EL) of the circuit board PCB.

As illustrated in FIG. 23B, in case that the connector CNT has a shape enclosing the entirety of the periphery of the circuit board PCB, the connection electrode CNE of the connector CNT may be provided in an annular shape such as a circular shape, a rectangular shape, or a polygonal shape, which forms a closed-loop enclosing the first and second electrodes EL1 and EL2 of the circuit board PCB.

In one or more embodiments, as illustrated in FIG. 23D, the connector CNT may include a first sub-connector CNT1 and a second sub-connector CNT2. In a sectional view, the first sub-connector CNT1 may be located in an upper portion, and the second connector CNT2 may be located in a lower portion. The first connector CNT1 may be connected to the second connector CNT2, thus forming the connector CNT.

A first connection electrode CNE1 may be formed in the first connector CNT1. A second connection electrode CNE2 may be formed in the second connector CNT2. In case that the first connector CNT1 and the second connector CNT2 are coupled to each other, the first connection electrode CNE1 and the second connection electrode CNE2 may be physically and/or electrically connected to each other. The first connection electrode CNE1 and the second connection electrode CNE2 that are electrically connected to each other may form the connection electrode CNE.

The first connection electrode CNE1 may directly contact the 1-1-th electrode EL1_1 and the 2-1-th electrode EL2_1 of the circuit board PCB and may be physically and electrically connected to the 1-1-th and 2-1-th electrodes EL1_1 and EL2_1. The second connection electrode CNE2 may directly contact the 1-2-th electrode EL1_2 and the 2-2-th electrode EL2_2 of the circuit board PCB and may be physically and electrically connected to the 1-2-th and 2-2-th electrodes EL1_2 and EL2_2.

Figure 24A:
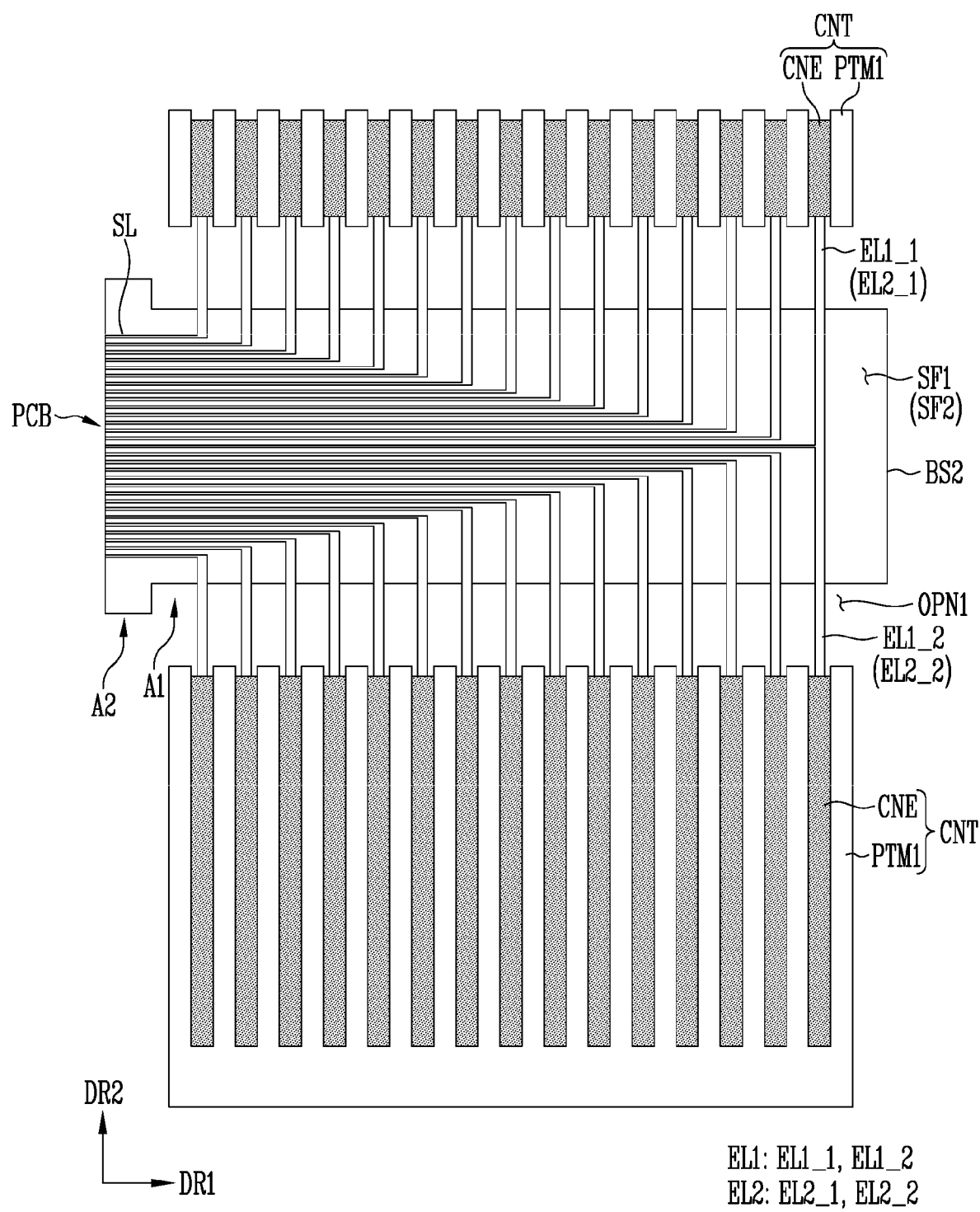
FIGS. 24A to 24C are schematic plan views illustrating various embodiments of the connection relationship between the circuit board and the connector.
Figure 24B:
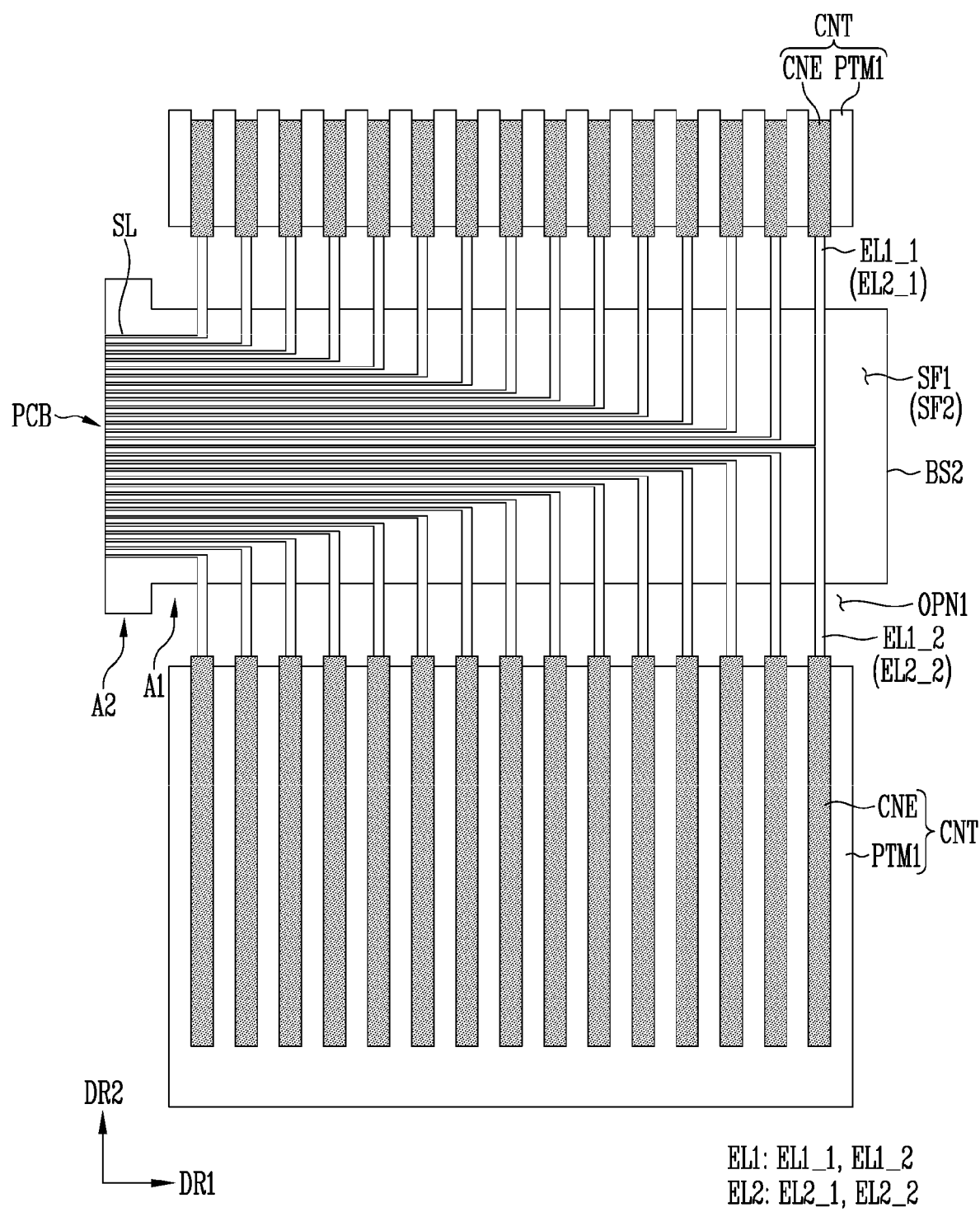
Figure 24C:
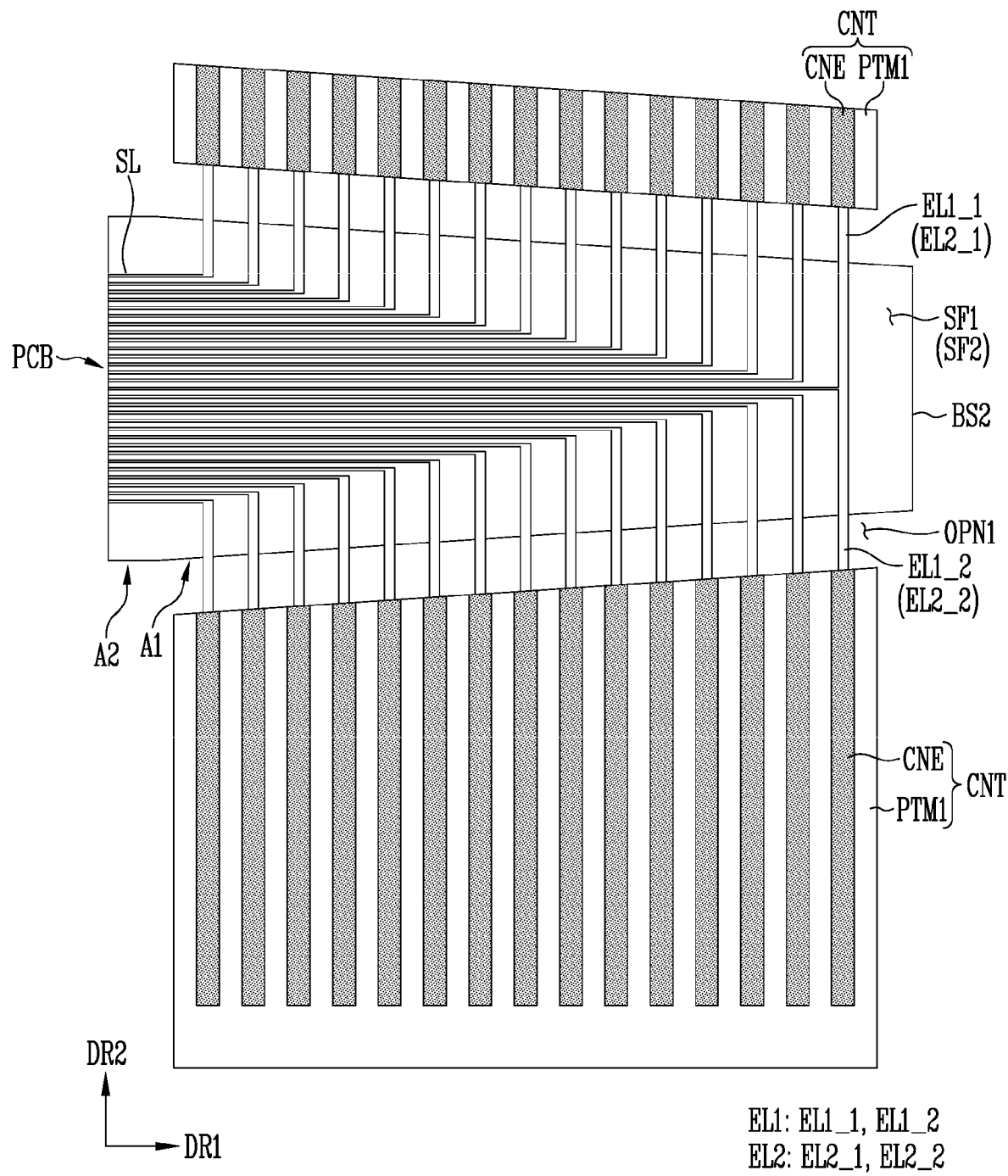

FIGS. 23A to 24C are schematic plan views illustrating various embodiments of the connection relationship between the circuit board PCB and the connector CNT. For the sake of description, FIGS. 24A to 24C each schematically illustrate a cut and developed view of the connector CNT having a cylindrical shape FIGS. 24A to 24C illustrate modifications of the embodiment of FIG. 21 with regard to shapes or the like of the connection electrodes CNE and the first protective component PTM1.

The following description related to the embodiments of FIGS. 24A to 24C will be focused on differences from the above-mentioned embodiments so as to avoid redundant description.

Referring to FIGS. 24A to 24C, the connector CNT may include a plurality of connection electrodes CNE, and a first protective component PTM1 disposed between the connection electrodes CNE.

As illustrated in FIG. 24A, the first protective component PTM1 may be disposed closer to the second base layer BS2 of the circuit board PCB than to each of the connection electrodes CNE, but the present disclosure is not limited thereto, and the reverse case is also possible. For example, as illustrated in FIG. 24B, each of the connection electrodes CNE may be disposed closer to the second base layer BS2 of the circuit board PCB than to the first protective component PTM1.

As illustrated in FIG. 24C, the connection electrodes CNE and the first protective component PTM1 may be designed such that vertical lengths thereof vary with respect to the first direction DR1. In this case, the second base layer BS2 of the circuit board PCB may also be designed such that a vertical width thereof varies with respect to the first direction DR1.

An embodiment of the present disclosure may provide a display device in which a structure including a connector and a support component is disposed inside a housing, and one side of a circuit board that protrudes (or is exposed) out of a rotator (or a roller) is electrically connected to the connector, so that, regardless of movement of the rotator (or an operation of winding or deploying a display panel), a conductive cable can be prevented from being increased in length, and internal space of the housing can be secured, whereby the ease of design of the display device can be enhanced.

The effects, aspects, and features of the present disclosure are not limited by the foregoing, and other various effects, aspects, and features are anticipated herein.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

What is claimed is:

1. A display device comprising: a display panel comprising pixels; a housing configured to receive the display panel, the housing including a slot at one side surface of the housing; a rotator located in the housing and configured to wind or deploy the display panel through the slot; a circuit board located in the rotator, and configured to be electrically connected to the pixels; a connector located in the housing, and electrically connected to the circuit board; and a support component configured to support the connector; and the connector comprises: a plurality of connection electrodes electrically connected to corresponding electrodes on opposite sides of the circuit board while the circuit board is rolling with respect to the connector; and a first protective component located between the plurality of connection electrodes; and the connector includes a first opening into which one side of the circuit board is inserted, the first opening enclosing a portion of the circuit board, and wherein each of the plurality of connection electrodes and the first protective component enclosing the one side of the circuit board.

2. The display device according to claim 1, wherein the connector has a closed loop shape enclosing an entirety of the one side of the circuit board.

3. The display device according to claim 1, wherein the connector has an open loop shape enclosing a portion of the one side of the circuit board without enclosing a remaining portion thereof.

4. The display device according to claim 1, wherein the support component comprises:
   a body configured to support the connector and including a second opening;
   a plurality of conductive patterns located in the second opening, and electrically connected to the connection electrodes; and
   a second protective component located in the second opening, the second protective component being located between the plurality of conductive patterns.

5. The display device according to claim 4, wherein the connector and the support component are integrally provided.

6. The display device according to claim 5,
   wherein each of the plurality of connection electrodes and each of the plurality of conductive patterns are integrally provided, and
   wherein the first protective component and the second protective component are integrally provided.

7. The display device according to claim 4, further comprising a conductive cable electrically connected to the connector and configured to transmit an electrical signal to the display panel through the connector, and coupled to an end of the body,
   wherein the conductive cable is electrically connected to the plurality of conductive patterns through a third opening located at one side surface of the body.

8. The display device according to claim 4, wherein the circuit board comprises:
   a base layer including a first surface and a second surface that are opposite each other;
   a first electrode on the first surface of the base layer; and
   a second electrode on the second surface of the base layer,
   wherein the first electrode and the second electrode protrude out of the base layer.

9. The display device according to claim 8, wherein each of the first and the second electrodes is electrically connected to a corresponding connection electrode from among the plurality of connection electrodes.

10. The display device according to claim 9,
    wherein the first electrode comprises one area bent in an upward direction of the first surface of the base layer, and
    wherein the second electrode comprises one area bent in an upward direction of the second surface of the base layer.

11. The display device according to claim 10, wherein the one area of each of the first and the second electrodes contacts an inner side surface of the corresponding connection electrode.

12. The display device according to claim 4, wherein the circuit board comprises:
    a first sub-base layer at a center of the first opening, and comprising a first surface and a second surface that are opposite each other;
    a first electrode on the first surface of the first sub-base layer;
    a second electrode on the second surface of the first sub-base layer;
    a second sub-base layer adjacent to the first surface of the first sub-base layer;
    a third electrode on the second sub-base layer, and electrically connected to the first electrode and a corresponding connection electrode from among the plurality of connection electrodes;
a third sub-base layer adjacent to the second surface of the first sub-base layer;
a fourth electrode on the third sub-base layer, and electrically connected to the second electrode and a corresponding connection electrode from among the plurality of connection electrodes; and
an elastic component located between the first surface of the first sub-base layer and the second sub-base layer and between the second surface of the first sub-base layer and the third sub-base layer.

13. The display device according to claim 4, wherein the circuit board comprises:
a base layer comprising a first surface and a second surface that are opposite each other in one direction, and a third surface and a fourth surface that are opposite each other in a direction intersecting the one direction;
a first electrode on the first surface of the base layer, the first electrode being in contact with and electrically connected to a corresponding connection electrode from among the plurality of connection electrodes;
a second electrode on the second surface of the base layer, the second electrode being in contact with and electrically connected to a corresponding connection electrode from among the plurality of connection electrodes;
a third electrode on the third surface of the base layer, the third electrode being in contact with and electrically connected to a corresponding connection electrode from among the plurality of connection electrodes; and
a fourth electrode on the fourth surface of the base layer, the fourth electrode being in contact with and electrically connected to a corresponding connection electrode from among the plurality of connection electrodes.

14. The display device according to claim 4, wherein the circuit board comprises:
a base layer having a shape corresponding to the first opening; and
an electrode located on a surface of the base layer, the electrode being in contact with and electrically connected to a corresponding connection electrode from among the plurality of connection electrodes.

15. The display device according to claim 4, wherein the circuit board comprises:
a base layer having a shape in which a portion of the first opening is filled with the base layer; and
an electrode located on a surface of the base layer, the electrode being in contact with and electrically connected to a corresponding connection electrode from among the plurality of connection electrodes.

16. The display device according to claim 4, wherein the circuit board comprises:
a base layer at a center of the first opening, and comprising a protrusion, wherein one side surface of the protrusion protrudes toward the connector; and
an electrode located on the protrusion, and electrically connected to a corresponding connection electrode from among the plurality of connection electrodes.

17. The display device according to claim 1, wherein the display panel comprises a rollable display panel.

18. A display device comprising: a display panel; a housing configured to receive the display panel, the housing including a slot at one side surface thereof; a mounting component located at one side of the housing; a rotator located in the housing and configured to wind or deploy the display panel through the slot; a circuit board located in the rotator, and electrically connected to the display panel; a structure located in the housing, the structure being adjacent to the rotator and configured to be electrically connected to the circuit board; and a conductive cable connected to the structure and configured to transmit a signal to the circuit board, wherein the structure comprises: a connector comprising a plurality of connection electrodes electrically connected to corresponding electrodes on opposite sides of the circuit board while the circuit board is rolling with respect to the connector, a first protective component located between the plurality of connection electrodes, and a first opening into which one side of the circuit board is inserted; and a support component comprising a body configured to support the connector, the support component including a second opening, a plurality of conductive patterns located in the second opening and electrically connected to the plurality of connection electrodes, and a second protective component located between the plurality of conductive patterns, wherein the connector and the support component are integrally provided.

* * * * *